(12) United States Patent
Zaboronski et al.

(10) Patent No.: US 7,822,138 B2
(45) Date of Patent: Oct. 26, 2010

(54) CALCULATING APPARATUS AND METHOD FOR USE IN A MAXIMUM LIKELIHOOD DETECTOR AND/OR DECODER

(75) Inventors: Oleg Zaboronski, Coventry (GB); Nicholas Atkinson, Warwickshire (GB); Robert Charles Jackson, Warwick (GB); Theo Drane, Warwickshire (GB); Andrei Vityaev, San Jose, CA (US)

(73) Assignee: Forte Design Systems Limited, Surrey (GB)

( * ) Notice: Subject to any disclaimer, the term of this patent is extended or adjusted under 35 U.S.C. 154(b) by 1748 days.

(21) Appl. No.: 10/867,179

(22) Filed: Jun. 14, 2004

(65) Prior Publication Data

US 2005/0094748 A1 May 5, 2005

Related U.S. Application Data

(60) Provisional application No. 60/517,176, filed on Nov. 4, 2003.

(51) Int. Cl.
*H04L 5/12* (2006.01)
*H03M 13/03* (2006.01)

(52) U.S. Cl. .................... 375/265; 375/262; 714/795

(58) Field of Classification Search ................ 375/265, 375/262–264, 340–343; 714/786–799
See application file for complete search history.

(56) References Cited

U.S. PATENT DOCUMENTS

| | | | |
|---|---|---|---|
| 4,644,564 A | 2/1987 | Dolivo et al. | |
| 5,042,036 A | 8/1991 | Fettweis | |
| 5,917,859 A | 6/1999 | Yamasaki et al. | |
| 5,946,361 A | * 8/1999 | Araki et al. | ........... 375/341 |
| 2002/0021770 A1 | 2/2002 | Beerel et al. | |

(Continued)

FOREIGN PATENT DOCUMENTS

GB     2383506     6/2003

OTHER PUBLICATIONS

"PCT Search Report filed in PCT /GB2004/002536", (Aug. 30, 2004), 7 Pages.

(Continued)

*Primary Examiner*—David C Payne
*Assistant Examiner*—Linda Wong
(74) *Attorney, Agent, or Firm*—Schwabe, Williamson & Wyatt, P.C.

(57) ABSTRACT

A calculator for use in a maximum likelihood detector, including: a receiver for receiving convolution encoded data which may include noise; first calculator for calculating a first component of a first path metric difference between two possible sequences of states corresponding to the convolution encoded data, the two sequences each having a length equal to a constraint length of the convolution encoded data, and the two sequences starting at a same state and ending at a same state, adapted to calculate the first component using the convolution-encoded data and using convolution encoding parameters of the convolution-encoded data, wherein the first component is independent of the two sequences; and second calculator for calculating a second component of the first path metric difference using the two sequences, wherein the second component is independent of the convolution encoded data; and using the first and second components to obtain the first path metric difference.

60 Claims, 14 Drawing Sheets

U.S. PATENT DOCUMENTS

| | | | |
|---|---|---|---|
| 2002/0040462 A1* | 4/2002 | Sawaguchi et al. | 714/794 |
| 2003/0067998 A1* | 4/2003 | Nakajima et al. | 375/341 |
| 2003/0194026 A1* | 10/2003 | Vasquez | 375/341 |
| 2004/0088429 A1* | 5/2004 | Luo | 709/232 |
| 2005/0044474 A1 | 2/2005 | Zaboronski et al. | |

OTHER PUBLICATIONS

"United Kingdom Search Report filed in Application No. GB0413104.1", (Oct. 13, 2004), 1 Page.

Altekar, S. A., "Improvements in Detectors Based Upon Colored Noise", *IEEE Transactions on Magnetics 34(1)*, (Jan. 1998),94-97.

Thapar, H. K., "A Block Processing Method for Designing High-Speed Viterbi Detectors", *IEEE International Conference on Communications, BOSTONICC '89*, vol. 2, (Jun. 11, 1989),1069-1100.

"PTC Search Report filed in PCT/GB2004/002537", (Aug. 9, 2004), 5 Pages.

"United Kingdom Search Report filed in Application No. GB0413103.3", (Oct. 19, 2004),1 Page.

Black, P. J., "A 140-Mb/s, 32-State, Radix-4 Viterbi Decoder", *IEEE Journal of Solid-State Circuits*, 27(12), (1992), 1877-1885.

Fitzpatrick, K. K., "A Difference Metric Implementation for Maximum-Likelihood Sequence Estimation of Binary Input Intersymbol Interference Channels", *Communication Theory Mini-Conference, GLOBECOM '95, IEEE*, (1995),860-864.

Fossorier, M. P., "Differential Trellis Decoding of Convolutional Codes", *IEEE Transactions on Information Theory*, 46(3), (2000), 1046-1053.

Ölçer, S., "Diifference-Metric Viterbi Decoding of Multilevel Class-IV Partial-Response Signals", *IEEE Transactions on Communications*, 42(2/3/4), (1994),1558-1570.

* cited by examiner

CALCULATING APPARATUS AND METHOD FOR USE IN A MAXIMUM LIKELIHOOD DETECTOR AND/OR DECODER

This application claims priority under 35 U.S.C. 119(e) to U.S. Provisional Patent Application No. 60/517,176, filed Nov. 4, 2003, which application is incorporated herein by reference.

FIELD

The present invention relates to calculating methods and apparatus for maximum likelihood detectors and/or decoders, and in particular to methods and apparatus for path metric calculation and/or path metric difference calculation.

BACKGROUND

A random process can be defined on the set of states of a finite state machine. A corresponding sequence of random state transitions can be visualised as a path on a trellis diagram. The problem of finding the most probable trellis path which connects two given states is of a great practical importance. This problem arises in such diverse areas as the theory of error-free communication, adaptive planning, the theory of traffic flows. In applications related to communication theories, most probable path-searching algorithms are used to reduce noise from signals transmitted over noisy channels (CDMA2000, Gigabit internet, etc), combat both inter symbol interference and channel noise in magnetic and optical storage devices, maintain communications with deep space research probes (e.g. Galileo).

Markov processes with Gaussian randomness are of particular practical importance, one example of which is an additive Gaussian white noise (AWGN) communication channel. In such a Markov process, the problem of finding the most probable path reduces to the problem of finding the path of lowest weighting on a trellis, whose branches are equipped with weightings which are real numbers called branch metrics.

This type of problem can be solved by techniques of maximum likelihood detection. Maximum likelihood detection may include detection of transmitted data and estimation of transmitted symbols which formed part of the data before the effect of noise and/or interference during transmission. Maximum likelihood detection may also include the further step of decoding the data from an encoded format, although this is not an essential feature of a maximum likelihood detector.

In the following discussion, the term "detection" includes the process of recovering signals that are subject to noise and/or known interference, such as inter-symbol interference (ISI) of a known shape. However, if a deliberate encoding process has also been performed on the data, "decoding" is required to recover the signals in their pre-encoded form. For example, if encoding has been performed on purpose to increase resistance of the transmitted signals to noise, then "decoding" can be used to obtain the original pre-encoded signals.

It follows that a "detector" does not require any decoding means for decoding from a deliberate encoding process. However, a detector which includes such decoding means for decoding from a deliberate encoding process may be known as a "decoder". The decoding means may be configured to work separately or integrally with the detection means. Thus, in the following discussion, a "decoder" is a type of detector which also performs decoding. The hard disk drive examples discussed below are maximum likelihood "detectors", because the process involved is recovery of signals, where no purposeful encoding was performed on the data. However, everything that is discussed below is also applicable to decoders.

Both detectors and decoders usually output an estimate of a signal before encoding or interference. However, it is possible for a decoder or a detector to output a different sequence, e.g. outputting encoded signals which are corrected for interference and/or noise, or correcting for transmission noise but not correcting for inter-symbol interference.

An example of a maximum likelihood detector (MLD) is a convolution detector, for detecting and decoding data in a convolution encoded format. Convolution encoding is a bit level encoding technique where each coded bit is generated by convolving the input bit with the past input bits. This can be done by temporarily storing past input bits in delay elements such as flip flops or other memory or storage elements. Thus the information content of each input bit is spread over a number of coded bits, improving the error resistance of the data. If the encoded bits are then transmitted through a noisy environment, and if a particular encoded bit is very strongly affected by noise, information relating to the original input bits is still preserved in the encoded bits which are less affected by noise. The constraint length K of the convolution encoder is the number of bit shifts over which a single input bit can influence the encoder output.

A further example of convolution encoding occurs in a hard disk read system. Each bit on the disk surface generates a magnetic field, which is detected by the disk read head in order to read the bit. However, the read operation is also affected by the magnetic field produced by the neighbouring bits. Thus, any data value obtained in a read operation actually corresponds to a convolution of magnetically recorded bits on the disc. This is known as inter symbol interference (ISI).

Convolution encoders can be classified according to their constraint length, and the weightings given to each previous bit. One type of convolution detector is known as "PR4" (partial response system of class IV). "Partial response" refers to the fact that several input bits each give a partial contribution to each output bit of a multi-bit detected sequence. A more complex example is an "E2PR4" detector, which has a constraint length of five. E2PR4 detectors are commonly used in modern hard disk read channels.

A convolution encoder may be modelled by a generator polynomial G(D), which describes the number of bits influencing the encoder output, and the magnitude of each bit's influence. The generator polynomial has the formula:

$$G(D) = \sum_{n=0}^{K-1} g_n D^n$$

where $D^n$ is a delay operator representing a delay of n time units, K is the encoder constraint length and $g_n$'s are real numbers, which describe the weight with which past transitions contribute to the current reading. An example of a PR4 encoder has a generator polynomial of $1-D^2$, and an example of an E2PR4 encoder has a generator polynomial of $1+2D-2D^3-D^4$.

A simpler example of a convolution encoder has a generator polynomial G(D)=1−D. This encoder has a single delay element for storing a previous input, and produces an output equal to the current input minus the previous input. Thus, the encoder operates on the input data $x_i$ to give an output of $G(D)x_i = x_i - Dx_i$. The delay operator acts to represent the previous (delayed) input, thus $Dx_i=x_{i-1}$, and $G(D)x_i=x_i-x_{i-1}$. The constraint length is 2 because each input bit influences the output over two bit shifts.

FIG. 1 shows a block diagram of a prior art apparatus for transmission and reception of convolution encoded data. The apparatus includes a convolution encoder 100, with generator polynomial $G(D)=1-D$. The apparatus of FIG. 1 may represent a communications system, with deliberate convolution encoding of data to increase noise resistance during transmission through a channel. However, it may also represent a hard disk read process, in which the convolution encoding is not deliberate, but is a result of inter symbol interference caused by the magnetic fields of the individual data bits on the disk.

The encoder 100 performs convolution encoding of a stream of input data. The data is then sent over a noisy channel. Noise source 104 represents the effect of noise during transmission of the data. The transmitted data is then received and decoded by a detector 108.

The encoder 100 has an input 101 for accepting a stream of time dependent input binary data $x_i$, where i represents the time interval. The input data is received by the encoder at a rate of k bits/second. The input 101 of the encoder 100 is connected to an encoder delay element 102. The delay element 102 stores a single bit of data, corresponding to the input bit $x_i$ at time i, and outputs this data bit at the following time interval i+1. Thus, at time i, the output of the delay element is $x_{i-1}$. The output of the delay element 102 is connected to a multiplication unit 103 which multiplies the output value $x_{i-1}$, by minus one, giving an output of $-x_{i-1}$. The encoder 100 has a sum unit 104 which is connected to both the encoder input 101 and the output of the multiplication unit 103. The signals $x_i$ and $-x_{i-1}$, are summed by the sum unit 104, to give an output signal of $y_i=x_i-x_{i-1}$.

The encoder output signal $y_i$ is sent from the output 105 of the encoder 100 via a channel, such as a radio link, a wire, or any other form of data transmission channel, to a detector 108. Noise source 106 represents noise $n_i$ generated as the signal $y_i$ passes through the channel. This may be any type of noise, for example, decorrelated noise such as white noise or Gaussian white noise. A sum unit 107, with inputs connected to the noise source 106 and the encoder output 105, represents the addition of the noise $n_i$ to the data $y_i$. Thus, the signal received after the data has passed through the noisy channel is $r_i=y_i+n_i$. The detector 108 receives the signal $r_i$, and the detector then performs a detection and convolution decoding process.

A prior art method of detection or detection and decoding of convolution encoded data uses a technique known as the Viterbi algorithm (VA). VA is a recursive procedure, which can be most easily described when used with a known initial state at time t=0, and a known final state at time t=T. VA allows the most likely sequence of states at intermediate times to be found. FIG. 2A shows an example of a two-state trellis diagram which can be used to visualise the VA process. The trellis diagram is a state transition diagram which graphically represents all of the possible states of the system over a sequence of time intervals. The horizontal axis of the trellis represents time, starting at time t=0 at the left hand side of the trellis, and ending with time t=T at the right hand side of the trellis. The vertical axis represents the possible states of the finite state machine. In this example, these possible states are zero and one, corresponding to the possible input states $x_i$ of the convolution encoder of FIG. 1. Pairs of possible states at adjacent time intervals are connected by lines, with each line representing a state transition to a different state or to an identical state during one time interval. The possible sequences of states over the whole of the time period are represented by the possible paths along the trellis. At time t=0, the system is pre-set to state zero. At the next time interval, t=1, the state may remain as zero or change to one. This is represented by the darker upper and lower lines of the trellis between t=0 and t=1. A change of state from zero to one is represented by the upper line, extending diagonally upwards to connect to one, and a sequence of all zero states is represented by the lower line, extending horizontally to connect to zero. At time t=1, if the system is in state one, it may follow one of two routes, i.e. remain at one, or change to zero. Similarly, if the system is in state zero, it may follow one of a further two routes, i.e. remain at zero, or change to one. At the final time t=T of the trellis of FIG. 2A, the system is reset to zero, thus only state zero is a possible state.

As can be seen from FIG. 2A, the trellis contains one or more paths between each possible initial and final state. For instance, there are two different paths from the "zero" state at time t=0 to the "zero" state at t=2. These paths are 010 and 000, where the first bit represents the state at time t=0, the second bit represents the state at time t=1, and the third bit represents the state at time t=2. FIG. 2B shows an identical trellis to FIG. 2A, with these two paths in bold lines. VA involves identifying paths between any possible states at time t−1, and each possible state at time t. If more than one path connects from t−1 to a particular state at time t, then VA chooses which of these paths corresponds to the most likely state sequence. Then, the least likely paths are eliminated. The remaining path is called the survivor.

The most likely path through the trellis can be determined using numbers known as branch metrics, which indicate the relative likelihoods of each of the possible state transitions in the trellis occurring. The branch metrics for each time interval may depend on the previous encoder state, and the new encoder input. The number shown beside each line in the trellis in FIGS. 2A and "B are the branch metrics. In one example, relating to FIG. 1, branch metrics may be obtained using the expected values $y_i$ of the received data $r_i$ and the actual values $r_i$ of the received data. The branch metrics in a path from time $t_1$, to time $t_2$ can be summed to indicate the likelihood of that path occurring. These sums of branch metrics are known as path metrics.

To find a survivor at a given state at t=t+1, the path metrics of all paths leading to this state are computed by adding appropriate branch metrics to path metrics of survivors at time t and choosing the path of lowest path metric (i.e. the highest likelihood path) leading to this state. This procedure is called add-compare-select operation and it has to be performed for all states at t=t+1. As t=T is reached, there will be only one survivor left, with probability $P=1-C_1 \cdot \exp(-C_2 \cdot T)$, where $C_1$ and $C_2$ are constants. Thus, the probability P approaches 1 as time T increases and $C_1 \cdot \exp(-C_2 \cdot T)$ becomes small.

VA is capable of reducing the amount of de-correlated noise, such as Gaussian white noise, from received data. VA may also be used to reduce the amount of coloured noise, if the correlation length of the noise is small enough.

FIG. 3 illustrates the use of VA by the detector 108 of FIG. 1, to detect the received data $r_i$, and output a corresponding sequence of values indicating the estimated encoder input values of highest likelihood. A series of eight trellis diagrams are shown, representing eight steps of the VA decoding process. A ninth trellis diagram shows a trace-back of the optimal path through the trellis. Again, the numbers on the trellis diagrams represent branch metrics, indicating the likelihood that received data corresponds to particular state transitions. Each trellis diagram is similar to that described with reference to FIGS. 2A and 2B, i.e. it has two possible states which are one and zero. These also represent the possible values of $x_{i-1}$, which are sequentially stored in the delay element 101.

The trellis extends from a known state of zero at time t=0 to a known state of zero at time t=T. A path through the trellis represents a sequence of data which is input to the encoder. Any unique data sequence input to the encoder has a unique path through the trellis. The initial state of each trellis is set to zero, by pre-setting the delay element to zero, i.e. setting the first value of $x_i$ to zero. The information which is to be convolution encoded and transmitted then begins with the second value of $x_i$. At the end of the information, an extra zero character is added to allow the last character of the information to be fully convolution encoded. It is not essential that this initial and final state should be zero, but in this example, their values should be known by the detector.

The states of the trellis, with a value of zero or one, represent possible values of $x_{i-1}$, where $x_{i-1}$ is a possible value of the convolution encoder input, which is stored in the delay element 102. The possible values of the convolution encoder output, $y_i = x_i - x_{i-1}$, are thus represented by the slope of the lines connecting two states of the trellis at adjacent time intervals i−1 and i. The values of $y_i$ are known as "branch labels", and they represent ideal values of the received data, without any added noise $n_i$. Lines with a zero slope, (such as the line between state zero at t=0 and state zero at t=1) correspond to $y_i=0$. Lines with a left-to-right upwards slope (such as the line between state zero at t=0 and state one at t=1) correspond to $y_i=1$. Lines with a left-to-right downwards slope (such as the line between state one at t=1 and state zero at t=2) correspond to $y_i=-1$.

When the detector receives the transmitted signal, this signal $r_i$ may include noise $n_i$. Thus, the problem to be solved by the detector is to determine the most likely path through the trellis (i.e. the most likely sequence of characters input to the encoder), based on the noisy received signal. The branch metrics are assigned to the trellis to indicate the likelihood of each state corresponding to the received signal at that time. For additive Gaussian white noise (AGWN), the branch metrics can be calculated as $(r_i - y_i)^2$, i.e. the square of the difference between the received value $r_i$ and the expected value $y_i$ at that point in the trellis. The most likely path is the path with the lowest path metric.

When the formula $(r_i - y_i)^2$ is used to calculate branch metrics for the two-state trellis of FIG. 3, it is common to get a lot of different paths having equal path metrics. It may not always be possible, therefore, to choose a single path of greatest likelihood, because one of two equally likely paths must be chosen. Therefore, for the purposes of illustrating the technique of finding a unique path through the trellis using VA, the values shown on FIG. 3 as branch metrics have not been calculated from a sample set of received data $r_i$, but instead, small integers have been chosen for each branch metric to ensure different weights for each path.

In practice, although the presence of multiple paths of equal likeliness degrades the VA performance, it is often possible to pre-process the data to avoid getting large numbers of equally likely paths.

The first trellis diagram, at the top of FIG. 3, corresponds to step 1 of the detection and/or decoding process. Step 1 concerns the time interval between t=0 and t=1. The state of the system at t=0 is zero, because the delay element was preset to zero before data transmission began. Two possible paths through the trellis during the first time interval are identified as bold lines on the trellis. These correspond to data sequences of 00 and 01 respectively, where the first bit represents the state at time t=0 and the second bit represents the state at time t=1. The 00 path is the lower of the two paths in the trellis, and the 01 path is the upper of the two paths in the trellis. The 00 path has a path metric of 0, but the 01 path has a path metric of 2. As only a single path is formed between the initial state at time t=0 and the next state at t=1, no reduction of the trellis is performed at step 1.

The second trellis corresponds to step 2 of the decoding process. The part of the trellis between t=0 and t=2 is now considered. A total of four paths are now possible, namely, 000, 001, 010 and 011, where the first two bits represent the possible paths in step 1, and the third bit represents the state at time t=2. The path metric of each path may be calculated by adding all the branch metrics on the path. Thus, the path metric of 000 is 0+2=2, of 001 is 0+0=0, of 010 is 2+1=3, and of 011 is 2+1=3. The paths 000 and 010, with path metrics of 2 and 3 respectively, both lead to a final state of 0 at time t=2. Therefore, the 010 can be eliminated, as it has the highest path metric, and the 000 path is the survivor. Similarly, the paths 001 and 011, with path metrics of 0 and 3 respectively, both lead to a final state of 1 at time t=2. Thus, the 011 path can be discarded, and the 001 path is the survivor. The two survivor paths, 001 and 000, are shown in bold on the trellis diagram.

In step 3 of the process, the part of the trellis up to t=3 is considered. The four new possible paths are 0010, 0011, 0000 and 0001, with path metrics of 0, 0, 3 and 4 respectively. The paths 0000, with path metric 3, and the path 0001, with path metric 4, can both be eliminated, as these have highest path metrics for final states 0 and 1 respectively. Thus, the survivors are 0010 and 0011, each with a path metric of 0.

In step 4 of the process, the part of the trellis up to t=4 is considered. The four new possible paths are 00100, 00101, 00110 and 00111, with path metrics of 1, 2, 2 and 0 respectively. The paths 00101 and 00110 can be eliminated, as these have highest path metrics for final states 1 and 0 respectively. Thus, the survivors are 00100 and 00111, each with a path metric of 0.

In step 5 of the process, the part of the trellis up to t=5 is considered. The four new possible paths are 001000, 001001, 001110 and 001111, with path metrics of 3, 3, 1 and 0 respectively. The paths 001000 and 001001 can be eliminated, as these have highest path metrics for final states 0 and 1 respectively. Thus, the survivors are 001110 and 001111, with path metrics of 1 and 0 respectively.

In step 6 of the process, the part of the trellis up to t=6 is considered. The four new possible paths are 0011100, 0011101, 0011110 and 0011111, with path metrics of 3, 2, 2 and 1 respectively. The paths 0011100 and 0011101 can be eliminated, as these have highest path metrics for final states 0 and 1 respectively. Thus, the survivors are 0011110 and 0011111, with path metrics of 2 and 1 respectively.

In step 7 of the process, the part of the trellis up to t=7 is considered. The four new possible paths are 00111100, 00111101, 00111110 and 00111111, with path metrics of 2, 4, 3 and 3 respectively. The paths 00111110 and 00111101 can be eliminated, as these have highest path metrics for final states 0 and 1 respectively. Thus, the survivors are 00111100 and 00111111, with path metrics of 2 and 3 respectively.

In step 8 of the process, the part of the trellis up to t=8 is considered. At t=8, the state is set to zero, since a reset signal will be sent at the end of each transmission. Thus, there are only have two paths to consider instead of four. The two paths are 001111000, 001111110, with path metrics of 2 and 4 respectively. As both paths have the same final state, the path 001111110, which has the highest path metric, can be eliminated. Thus, the only survivor is 001111000, with a path metric of 2.

The ninth trellis shows trace-back of the path with the lowest overall path metric, where only the final survivor path is shown in bold, and dead-end paths are no longer shown in bold.

In the absence of any additional noise $n_i$, the received data input to the detector or decoder is an "ideal input". For a trellis of finite length, an ideal input is a sequence of received data with a corresponding path in the trellis which has a path metric of zero. In other words, for an ideal input, there is a corresponding path which has a sequence of branch labels which is equal to the sequence of received data.

High speed implementations of maximal likelihood detectors (MLDs) such as the above (1−D) example, PR4 detectors and E2PR4 detectors, rely on a simultaneous computation of a large number of branch metrics of length n, where n is the number of time steps of the trellis processed in parallel. Such detector designs are referred to as radix-$2^n$ designs. It is often convenient to choose n to be equal to the constraint length of the detector. The constraint length is the smallest number of time steps on the trellis for which loops, i.e. multiple paths connecting a given state at time T to a given state at time (T+n), appear. For example, E2PR4 has a constraint length of 5, thus the length of branch metrics for minimum loop size is 5, and the radix of corresponding designs is $2^5$=32. The calculation of a large number of branch metrics is both time and area consuming, and this is a limiting factor in a high speed MLD design.

An increase in the detector's throughput can be achieved by increasing its radix. However, the area penalty for such increase can be significant. For example, radix-32 implementation of a "sliding-window" type E2PR4 MLD requires the computation of branch metrics for paths connecting each of 16 initial states to each of 16 final states, where two paths are obtained for each connection. This is 512 different paths on the corresponding trellis. If this computation is performed in 512 independent blocks, the total area of the branch metric block alone will be approximately 512×10000 μm²≈5 mm². In comparison, the total area of currently used high speed radix-4 detectors is approximately 0.6 mm².

SUMMARY

One aspect of the present invention can provide a reduction in the complexity of path metrics computation, and thus a reduction of the area needed for a maximum likelihood detector.

The inventor has realised that there are a large number of relations between branch metrics of various paths on the trellis. Such relations can be used to reduce the number of independent calculations required to determine path metrics of all paths. By finding and utilising these relations between branch metrics of different paths, the area necessary for a detector chip can be reduced.

A first aspect of the present invention provides a method and apparatus for simplifying path metric calculation, using a relation between branch labels of paths on the trellis, where the paths have a common initial state, a common final state, and a length equal to the constraint length K.

The apparatus of the first aspect of the invention may be a calculating apparatus for use in a maximum likelihood detector, and the method may be a method performed by the calculating apparatus. The apparatus may be configured to receive convolution encoded data which may include added noise. The apparatus may include first calculator for calculating a first component of a path metric difference between two possible state sequences, and second calculator for calculating a second component of the path metric difference.

The first and second components may add together to give the path metric difference. The first and second calculators may be separate calculating means, or they may share a common element, such as a common processor element. However, the inputs required by each calculator is different.

In this aspect of the invention, each of the two state sequences has a probability of corresponding to a length K section of received data, where K is a constraint length of the received data. The two sequences start at a common state and end at a common state. The first component is calculated using said received data and using convolution encoding parameters of the received data. However, the first component is independent of the two state sequences. The second component is calculated using the two state sequences, but is independent of said received data. The first and second components can be used to determine relative likelihoods that each of the two sequences corresponds to the section of received data. For example, they can be used to calculate a path metric difference between the two state sequences, or they can be used in the calculation of path metrics of either of the sequences.

Some embodiments of the invention include further simplifying path metric calculation by using a relation between pairs of paths of length K, with either a common initial state or a common final state.

A further aspect of the present invention provides a method and apparatus for simplifying path metric calculation, using a relation between branch labels of paths on the trellis, where the paths have any length, and the paths have a common initial or final state.

A yet further aspect of the present invention provides a method and apparatus for simplifying path metric calculation, using a relation between branch labels of paths on the trellis, where the paths have a common initial state, a common final state, but different middle states half way between the initial and final states, and where the path lengths are equal to twice the constraint length.

As an alternative to calculating actual branch metrics using any of these relations, a difference between branch metrics may be calculated, or any other indication of relative likelihoods of branch metrics may be calculated.

The calculating apparatus may receive convolution encoded data which has been generated according to a generator function G(D), but which may include additional noise $n_i$, added after generation by the generator function, but before reception of the data by the calculating apparatus. An example of a generator function is $$G(D) = \sum_{n=0}^{K-1} g_n D^n$$

where $D^n$ represents delaying an input to the generator by n time units, and $g_n$ are numbers representing the weight with which an input delayed by n time units will affect the encoder output. K is the encoder constraint length.

The calculating apparatus may output a sequence of values, each of which corresponds to a generator function input, where the output sequence indicates the highest likelihood sequence corresponding to the received data. In a two state system, the output may be equal to the state sequence. Alternatively, the calculating apparatus may output ideal values of the generator function outputs, which are ideal because they have no added noise $n_i$. Note that there may be other types of noise present in the ideal values, other than the transmission noise $n_i$, thus although the ideal values may be noise free, then this is not essential. Thus, in the present invention, the ideal values of the calculating apparatus input may be noise-free values, or reduced noise values, or values with a reduced noise component, when compared with the noise in the originally received data. "Noise" may include, for example, transmission noise, transmission interference, timing error, jitter, misequalization, inter-track interference, DC-offset, non-linear bit shift, overwrite, particulate noise, transition noise and/or percolation. Some embodiments of the present invention may be effective in reducing a first type of noise, but less effective in reducing a second type of noise which is also influencing the data.

The path metric difference may be calculated using the received data and the ideal input values of the calculating apparatus input. The path metric difference between two paths indicates the relative likelihoods of these paths. The path metric difference between a first and a second path, each of length K, starting and ending at common states, may be represented as two individual components, one of which is independent of the values of the received data, and the other of which is dependent on the received data, but independent of the particular paths chosen.

The component which is independent of the received data may be pre-calculated before the detector begins to process the corresponding received data. However, it is not essential to pre-calculate this component. E.g., instead, this component may be calculated while the data is being received, e.g. in parallel with the calculation of another component, which depends on the received data.

The other component may be calculated once for an arbitrary pair of length K paths with common initial states and common final states, then re-used for other paths corresponding to the same section of trellis, i.e. the same received data values. This component is calculated using parameters of the generator function G(D), e.g. in the above example, using the coefficients $g_n$. The two components are added together to obtain the path metric difference.

The data values may have been deliberately encoded e.g. using convolution encoding, but may then have been altered by the addition of noise, e.g. during transmission in a communication channel. Alternatively, the data values may have been obtained in a convolution encoded format arising from a non-deliberate process such as interference, e.g. when reading data from a magnetic disk drive. A further possibility is that the data values may be for fitting to a finite state model, such as in a voice recognition system.

In further embodiments of the invention, the path metric difference between a first of the first and second paths and a third path of length K are also calculated, where the third path shares one of its ends, but not the other end, with the first path. The first and second paths are the upper and lower paths of a loop (or lower and upper paths respectively), and the third path also has a corresponding upper or lower path, referred to as the fourth path, within the same section of trellis. The calculating means may calculate a first component of the path metric difference between the first and third paths using the modulus of the path metric difference between the first path and the second path, and using the modulus of the path metric difference between the third path and the fourth path. The calculating means may then calculate a second component of the path metric difference between the first and third paths using the received data, and the path metric difference is obtained by adding the two components. The part of the path metric difference which is independent of the received data may be pre-calculated, but this is not essential.

The first and third paths may be chosen with a common initial state but different final states, or may be chosen with a common final state and different initial states.

The maximum likelihood detector according to some embodiments of the invention is capable of reducing the amount of de-correlated noise, such as Gaussian white noise, from received data. For a system with additive Gaussian white noise (AGWN), the branch metrics may be calculated as the sum of the square of the difference between the encoder output value $y_i$ corresponding to that branch and the corresponding received convolution encoded data, summed over all values in the path. Alternatively, a different formula may be used to calculate the branch metrics.

The calculating apparatus may be configured to process sequences of encoded data for a chosen size of the constraint length K, such as K=2 or K=5. The calculating apparatus may be configured to receive a signal indicating the value of K for a particular data set, and adapt to use that value of K for that particular data set.

In one embodiment of the invention, the output values from the calculating apparatus may be identical to the ideal input values of the calculating apparatus. However, in a further embodiment, the output values from the calculating apparatus may correspond to a de-convolved sequence of ideal input values of the calculating apparatus, i.e. the ideal input values may be the convolution encoded values corresponding to the output values.

A further aspect of the invention is a maximum likelihood detector which uses at least one of the described relations between path metrics. Some embodiments of the invention relate to maximum likelihood detectors used in modern hard disk drives read channels. The inter symbol interference in the read channel is modelled by a generator polynomial G(D), which may be of the form described above. The stream of data produced in the process of reading can be then associated with the path on a trellis diagram. The trellis' structure is completely determined by the generator polynomial.

Further embodiments of the present invention provide a fast detector for decoding convolution encoded data. In these embodiments, the detector has an input for receiving a stream of data which has been convolution encoded and which may have been transmitted over a noisy channel, thus adding noise to the received signal. The detector has a memory with information about the possible ideal input values of the data. The detector has calculating means for determining an error value between each expected received signal and the actual received signal. The detector may have a storage means for storing information on the accumulated error corresponding to any particular sequence of originally sent data. The detector may also have a storage means for storing information on preferred paths in the trellis.

The size of each said section of input data processed by the detector may be less than 5 times the constraint length, which allows a fast throughput of data. However, this is not essential.

The present invention can be implemented by software or programmable computing apparatus. Thus the present invention encompasses a carrier medium carrying computer readable code for controlling a computer or number of computers to carry out the method. The carrier medium can comprise a transient medium, e.g. an electrical, optical, microwave, RF, electromagnetic, acoustic or magnetic signal (e.g. a TCP IP signal over an IP network such as the internet), an structures for carrying such a signal, or a carrier medium such as a floppy disk, CD ROM, hard disk, or programmable memory device.

BRIEF DESCRIPTION OF DRAWINGS

Embodiments of the present invention will now be described, by way of example only, with reference to the accompanying drawings, in which.

DESCRIPTION

Figure 4:
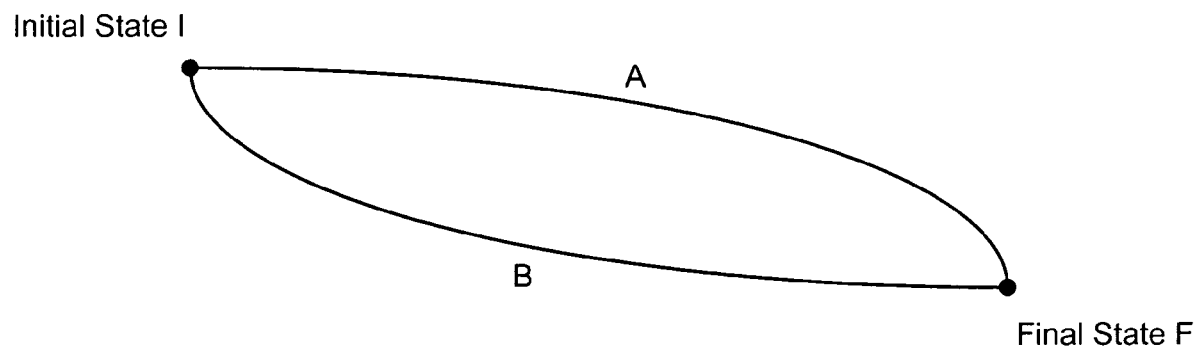
FIG. 4 shows part of a trellis diagram, illustrating the relationship between path metrics of two paths in the same loop of length K.

Two different paths in a trellis may form a loop by starting and ending at common states. FIG. 4 represents two paths through a trellis, labelled A and B, where each has length equal to the constraint length K.

A relationship between branch metrics of two paths within the same length K loop is now described with reference to FIG. 4. The paths A and B each connect an initial state I and a final state F. Path A is the upper path, consisting of a series of states with branch labels $a_0, a_1, a_2$, etc, and path B is the lower path, consisting of a series of states with branch labels $b_0, b_1, b_2$, etc, where the subscripts denote the time interval. The branch metrics for the i-th state in the upper and lower paths respectively are thus $(a_i-r_i)^2$ or $(b_i-r_i)^2$, where $r_i$ is the received data at time i.

As a general rule, any two points on the trellis separated by time interval less than K are either not connected or are connected together by a single path. This is because in general it takes K−1 time intervals to set the delay elements to hold a given set of $x_i$ values.

Points separated by a time interval greater or equal to K are always connected by 2 or more paths. In particular, any two points separated by K time steps are connected with exactly two paths. This is because at the initial state, the two paths are identical and each have the same set of values stored in the delay elements. If the first state differs between the two paths, then the delay element contents are no longer identical. It then takes K−1 time intervals to "flush" the delay elements to contain the same set of values for each path. One of the paths may be referred to as the "upper path", and the other path referred to as the "lower path". For two length K paths with same initial states, but different second states, the upper path corresponds to a first new ideal input value 1, and the lower path corresponds to a first new ideal input value of 0.

The branch labels $a_1$ and $b_1$ of the upper and lower paths in a loop are related to each other, and this relation leads to a significant reduction in the complexity of computation of path metrics differences for sets of paths of length K, which start on a common state and end on a common state. The following observation provides this relation between branch metrics of paths A and B in FIG. 4.

Observation 1: Let $(a_0, a_1, \ldots, a_{K-1})$ and $(b_0, b_1, \ldots, b_{K-1})$ be the branch labels of upper path A and lower path B connecting any two states $S_I$ and $S_F$. Then the vector of differences of these labels is independent of $S_I$ and $S_F$. Its components are equal to the coefficients of the generator polynomial G(D). In other words, $$a_n - b_n = g_n, n=0, 1, 2, \ldots K-1.$$

The result of this relationship is that the path metric difference $P_a - P_b$ can be split into a first part S(A,B) which is independent of the received data $R_i$, but depends on the paths A and B, and a second part $\Sigma g(i)R(i)$ (summed over i=0 to K−1) which is independent of the paths A and B, but is dependent on the received data.

Observation 1 can be applied to decide the most likely path out of all paths of length K which start at a common state and end at a common state. This is useful in maximal-likelihood decoding.

Combinations of branch labels which do not depend on initial and/or final states of a path can be referred to as path invariants or simply invariants. Observation 1 gives an example of invariants of both initial and final states, also known as loop invariants.

The following two observations are further examples of path invariants, and can be used to give a further reduction in the time required for computation of path metrics.

Observation 2 (Invariants of the final state.) Two paths which converge to a given state $S_F$, are chosen. The first path originates from state $S_I$, and the second path originates from state 0. The branch labels of the paths from $S_I$ and 0 are $(a_0, a_1, \ldots, a_{L-1})$ and $(b_0, b_1, \ldots, b_{L-1})$ correspondingly. Then $$a_n - b_n = f_n(S_i), n=0, 1, 2, \ldots L-1,$$

where $\{f_n\}_{n=1, 2, \ldots L-1}$ is the set of numbers, which depends on the initial state $S_I$, but not on the final state $S_F$. L is the length of each path. L may be equal to the constraint length K, however, the above relation also holds for paths of length less than constraint length K. For L<K, $f_n$ is also independent of the paths. However, for L=K, $f_n$ depends on both the initial state $S_i$ and also on whether an upper-upper, upper-lower, lower-upper or lower-lower path combination was chosen. For L>K, $f_n$ becomes dependent on the actual paths chosen, as well as on the initial state $S_I$. It is not essential for one of the initial states to be a zero state, as it could alternatively be any other fixed state.

In embodiments where L=K, it can be assumed that each paths form either a lower part or an upper part of a corresponding loop, where a loop is a pair of paths which start at a common state and end at a common state, but differ in at least one of their intermediate states.

Figure 5A:
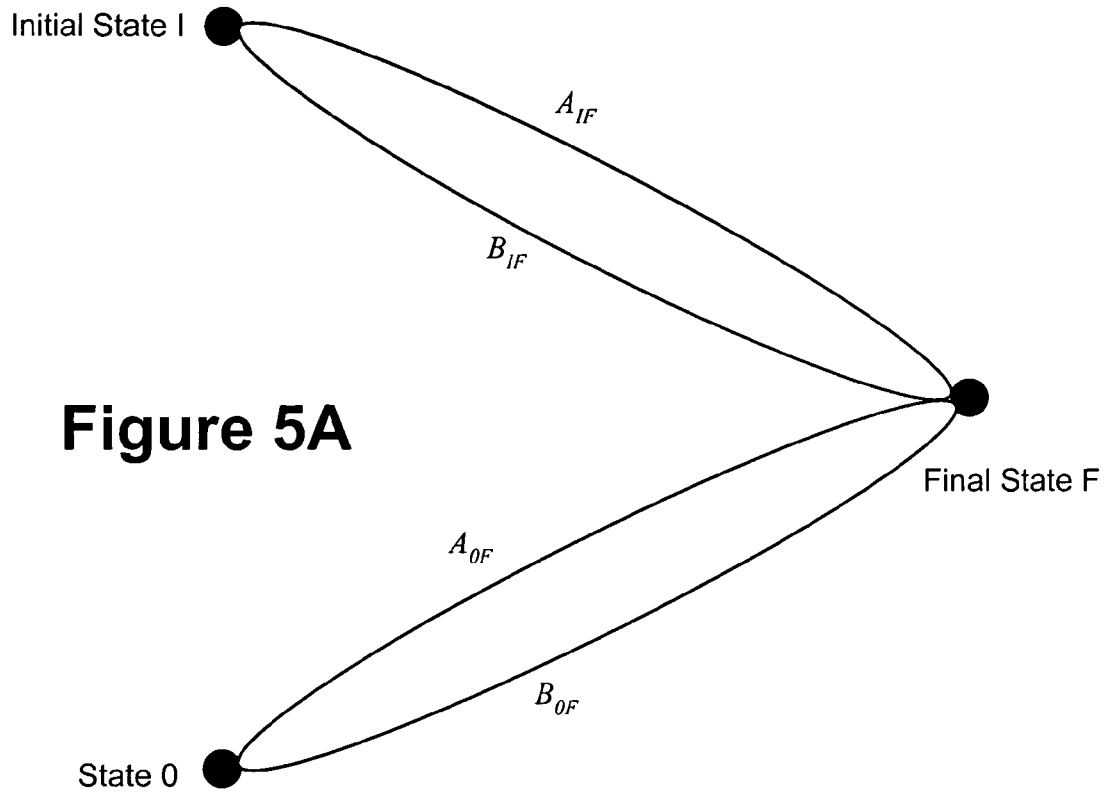
FIG. 5A shows part of a trellis diagram, illustrating the relationship between the paths of length K from two different initial states to a single final state.

FIG. 5A represents a part of the trellis of length K. Two pairs of paths $A_{IF}$, $B_{IF}$ and $A_{OF}$, $B_{OF}$ are shown, each pair forming a loop. The two loops start at different initial states I and 0, but end on the same final state F. One loop connects state I to state F, and the second loop connects state 0 to state F. Observation 2 provides a relationship between one of the two paths $A_{IF}$ or $B_{IF}$ between I and F, and one of the two paths $A_{OF}$ or $B_{OF}$ between 0 and F. Thus, observation 2 may be used to provide a relation between both upper paths $A_{IF}$ and $A_{OF}$, or both lower paths $B_{IF}$ and $B_{OF}$, or one upper path and one lower path, i.e. $A_{OF}$ and $B_{OF}$ or $A_{OF}$ and $B_{IF}$.

The path metric difference between one path from each loop can be split into a part which is dependent on both the initial and the final states but independent of the received data $R_i$, and a part which is independent of the final state F, but which is dependent on the received data $R_i$.

A similar result can be established for diverging paths of length K, as follows:

Observation 3 (Invariants of the initial state.) Two paths are chosen, which originate from a given state $S_I$. The first path terminates at a state $S_F$, and the second path terminates at state 0. The branch labels of paths terminating at $S_I$ and 0 are ($a_0$, $a_1$, ..., $a_{L-1}$) and ($b_0$, $b_1$, ..., $b_{L-1}$) correspondingly. Then $$a_n - b_n = h_n(S_f), n=0, 1, 2, \ldots L-1,$$

where $\{h_n\}_{n=1, 2, \ldots L-1}$ is the set of numbers, which depends on the final state $S_F$, but not on the initial state $S_I$. L is the length of each path. L may be equal to the constraint length K, however, the above relation also holds for paths of length less than K. For L<K, $h_n$ is also independent of the paths. However, for L=K, $h_n$ depends on both the final state $S_F$ and also on whether an upper-upper, upper-lower, lower-upper or lower-lower path combination was chosen. For L>K, $h_n$ becomes dependent on the actual paths chosen, as well as on the final state $S_F$. It is not essential for one of the final states to be a zero state, as it could alternatively be any other fixed state.

In some embodiments, observation 2 or observation 3 is used together with observation 1. However, this is not essential, and any one of the three observations may be used independently of the others, or in any combination with one or both of the others.

Figure 5B:
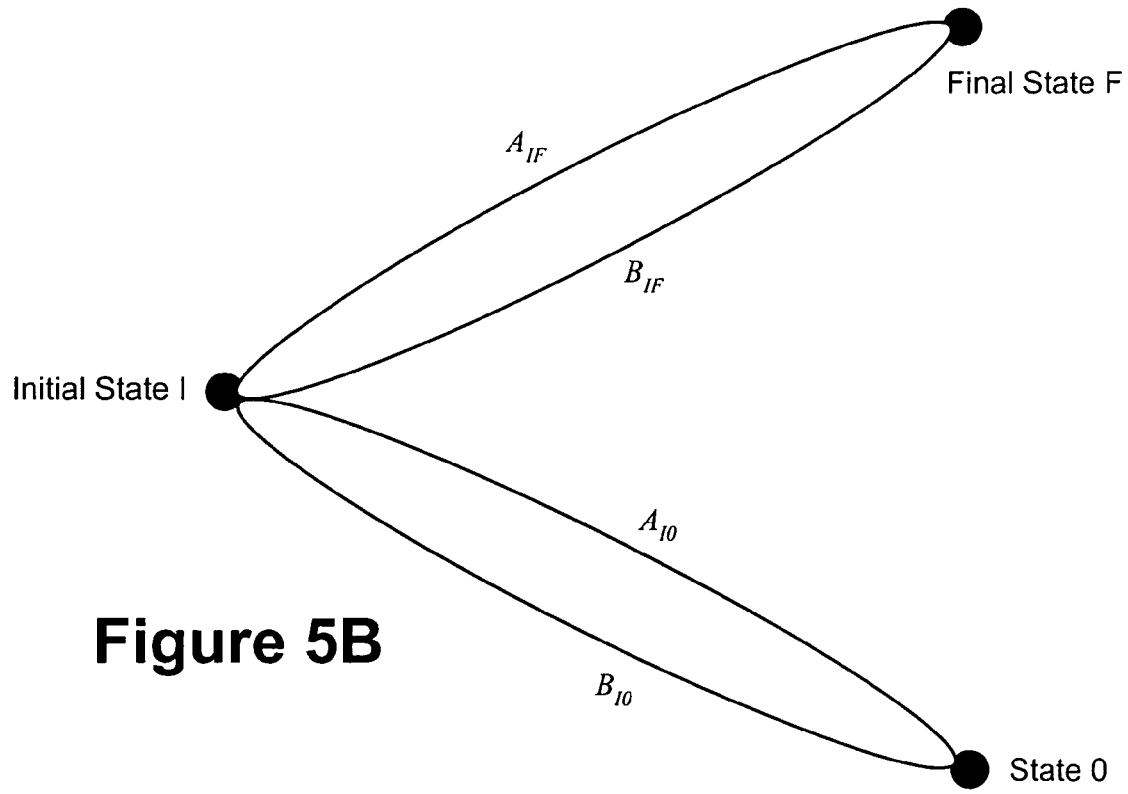
FIG. 5B shows part of a trellis diagram, illustrating the relationship between the paths of length K from a single initial state to two different final states.

FIG. 5B illustrates part of the trellis for paths of length K which start at the same initial state I, but end on different final states F,0. One loop connects state I to state F, and a second loop connects state I to state 0. Observation 3 provides a relation between one of the two paths $A_{IF}$ or $B_{IF}$ between I and F, and one of the two paths $A_{IO}$ or $B_{IO}$ between I and 0. Thus, observation 2 may be used to provide a relationship between both upper paths $A_{IF}$ and $A_{IO}$, or both lower paths $B_{IF}$ and $B_{IO}$, or one upper path and one lower path, i.e. $A_{IF}$ and $B_{IO}$ or $A_{IO}$ and $B_{IF}$.

The path metric difference between one path in each loop can be split into a part which is dependent on both the initial and the final states but independent of the received data $R_i$, and a part which is independent of the initial state I, but which is dependent on the received data $R_i$.

Observations 2 and 3 together may be used to help calculate path metrics for paths of length 2K.

Figure 6:
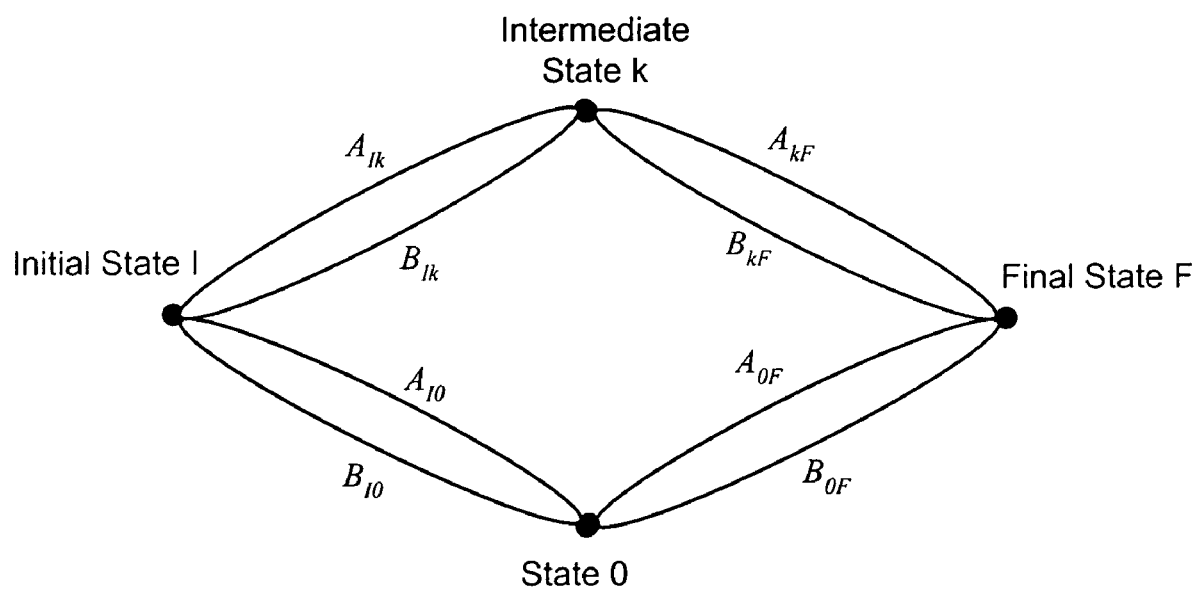
FIG. 6 shows part of a trellis diagram, illustrating the relationship between the paths of length 2K from a single initial state to a single final state.

FIG. 6 represents part of a trellis of length 2K, which shows eight paths, $A_{Ik}A_{kF}$, $A_{Ik}B_{kF}$, $B_{Ik}A_{kF}$, $B_{Ik}B_{kF}$, $A_{IO}A_{OF}$, $A_{IO}B_{OF}$, $B_{IO}A_{OF}$ and $B_{IO}B_{OF}$, all starting at one initial state I. Half of the paths form a first loop between state I and an intermediate state k half way along the 2K section of trellis. The rest of the paths form a second loop between state I and an intermediate state 0. All of the paths then converge to a final state F, forming a third loop between k and F, and a fourth loop between 0 and F.

Observations 2 and 3 can be combined to provide a relationship between the path metrics of paths in FIG. 6. The first part of the loop may be treated as the situation of FIG. 5B, and the second part of the loop may be treated as the situation of FIG. 5A. The path metric difference between two paths in FIG. 5A, added to the path metric difference between two paths in FIG. 5B, gives the path metric difference between the corresponding paths in FIG. 6.

This path metric difference has a part which is independent of both I and F, but is dependent on intermediate state k, and is also dependent on the received convolution encoded data. It has a second part which is dependent on I, F and k, but is independent on the received convolution encoded data. This second part can be pre-calculated for each possible I, F and k.

Figure 7:
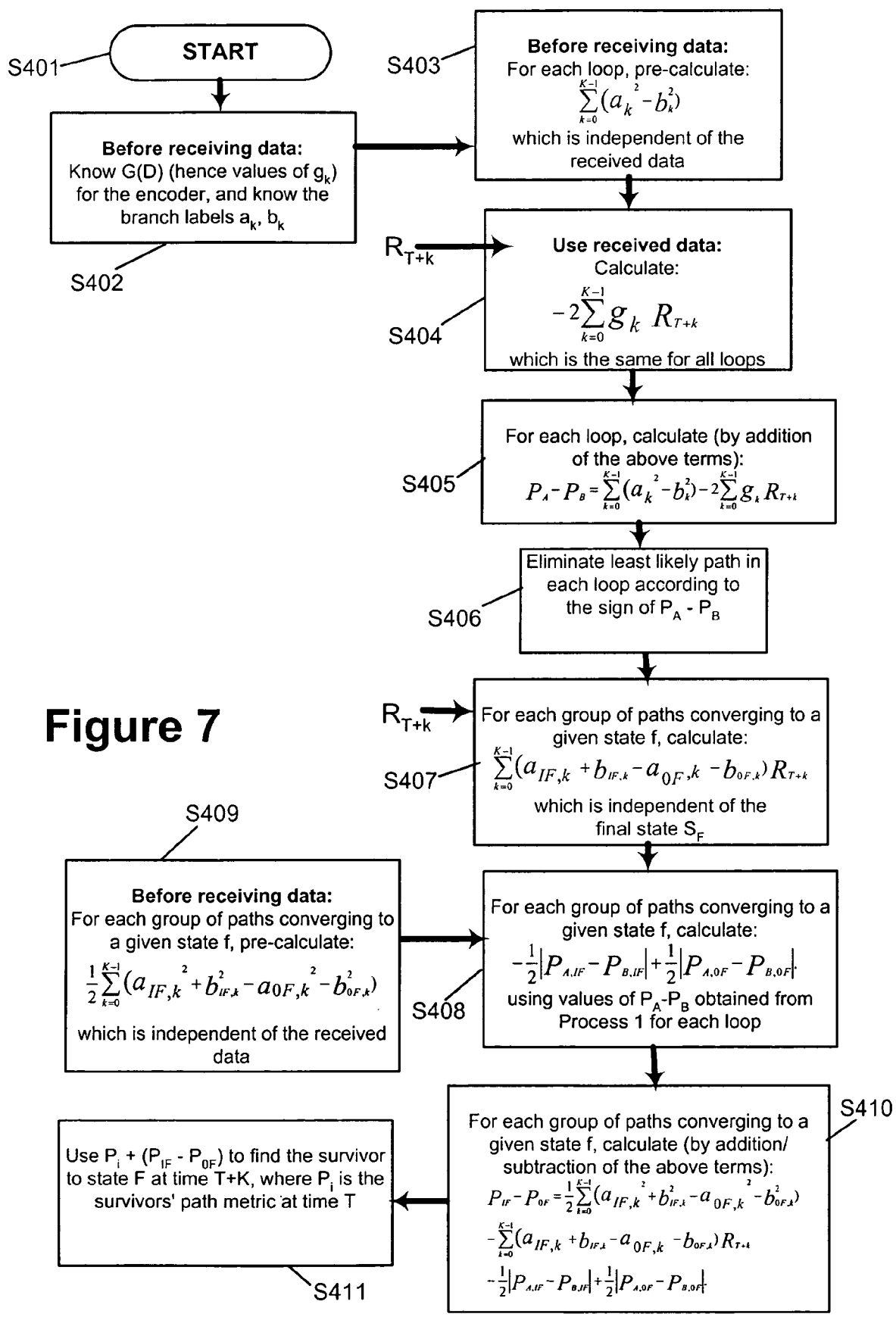
FIG. 7 is a flowchart showing a method of calculating path metric differences according to an embodiment of the invention.
Figure 8:
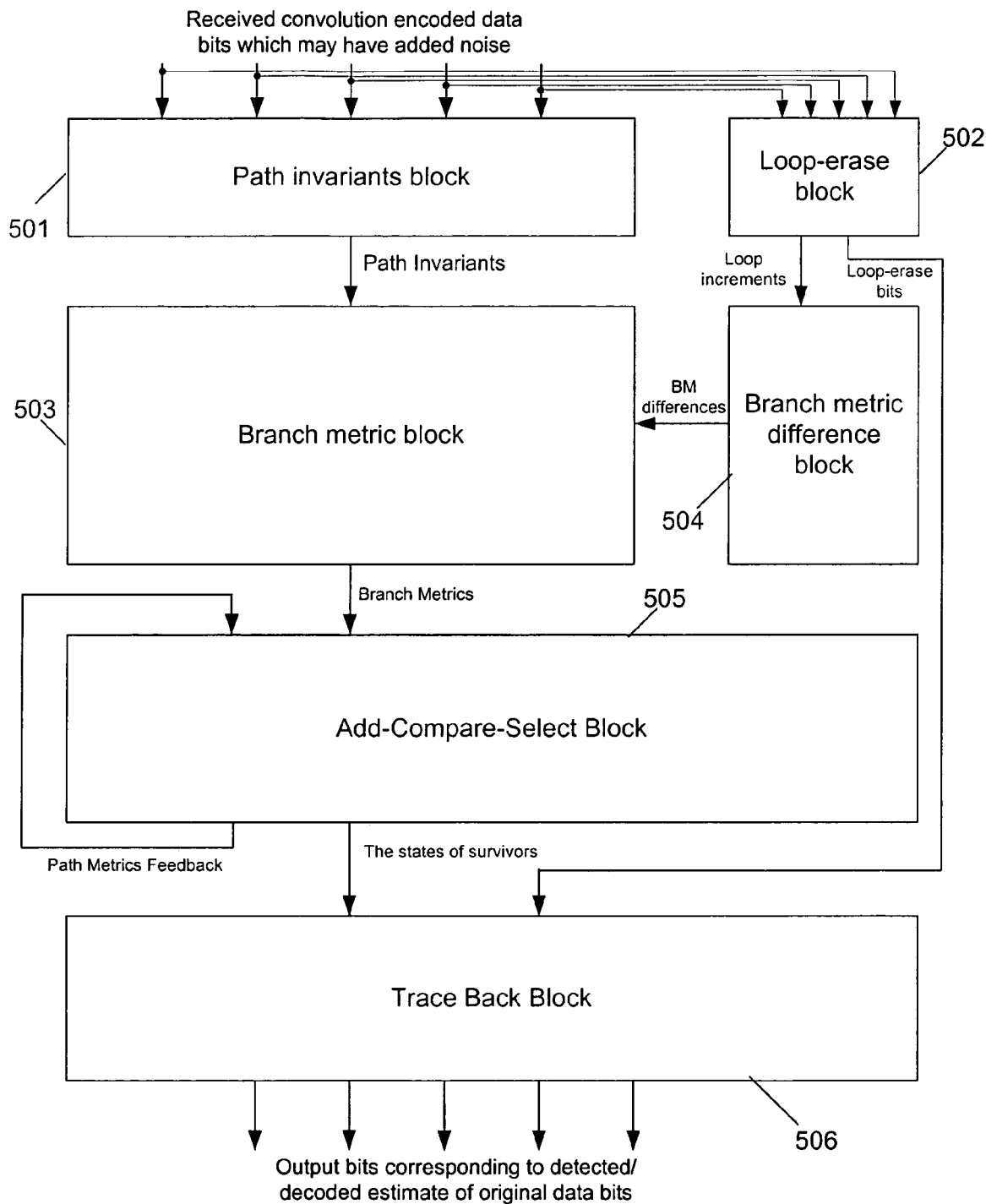
FIG. 8 is a block diagram of an E2PR4 detector according to an embodiment of the invention.

FIG. 7 is a flowchart showing a process for radix $2^K$ computation according to an embodiment of the invention, and FIG. 8 shows a block diagram of a E2PR4 convolution detector, according to an embodiment of the invention. The application of observations 1, 2 and 3 in these embodiments will now be described.

The branch metric of a branch connecting two states at times T and (T+1) and labelled by a is equal to $$(a-R_T)^2 = (a^2 - 2a\,R_T + R_T^2),$$

where $R_T$ is the signal received at time T. Note that the last term on the right hand side of the above equation is the same for all branches. As the path of greatest likelihood is of interest, this term can therefore be subtracted from all branch metrics. The path metric of a path with labels ($a_0, a_1, \ldots, a_{K-1}$) starting at some state at time T is $$P_a = \sum_{k=0}^{K-1} a_k^2 - 2\sum_{k=0}^{K-1} a_k R_{T+k}.$$

The following example illustrates the use of the invention in radix-$2^K$ computation.

Step 1: Resolve all loops of length K in the section of the trellis [T, T+K] using observation 1. There are $2^{2K-2}$ such loops. Yet, according to observation 1, for two paths ($a_0$, $a_1$, ..., $a_{K-1}$) and ($b_0$, $b_1$, ..., $b_{K-1}$) forming any loop, $$P_a - P_b = \sum_{k=0}^{K-1} (a_k^2 - b_k^2) - 2\sum_{k=0}^{K-1} g_k R_{T+k},$$

where $g_k$'s are the coefficients of the generator polynomial. It can be seen that the second term on the right hand side of the above equation for $P_a - P_b$ is the same for all loops. The first term is independent of the received signal and can be easily pre-computed.

This process is followed in FIG. 7. FIG. 7 begins at step S401. Before beginning calculation of branch metrics, the generator polynomial G(D) is known, and the branch labels are known, as shown at step S402. At the next step, S403, the first term in the equation for $P_a-P_b$ above is calculated, and this can be pre-calculated for each time interval because it does not need any knowledge of the received data. At step S404, the received data and the coefficients $g_k$ of the generator polynomial are used to calculate the second term in equation for $P_a-P_b$, which is the same for all loops. At step S405, the two terms of the equation are added together to obtain the branch metric difference $P_a-P_b$ for the loop. This branch metric difference may simply be used to eliminate the least likely path in each loop, as shown at step S406. In embodiments which use only observation 1, the process would stop here. However, the branch metric difference may also be used during the process of applying observation 2, which is described in steps S407 to S410.

The detector of FIG. 8 has five inputs for receiving five consecutive convolution encoded data bits $R_{T+k}$. These inputs are each connected to a path invariants block 501 and a loop-erase block 502 for eliminating least likely paths within a loop. It is the loop-erase block 502 which performs steps S403 to S406, thus erasing loops of length K. The loop-erase block 502 outputs the branch metric differences between two paths within a loop, and these branch metric differences are passed to a branch metric difference block 504, which is part of the structure used to apply observation 2. The loop-erase block 502 also outputs the surviving path within each loop to a trace back block 506.

The application of observation 2 is described as follows.

Step 2: Compute path metrics difference ($P_{IF}-P_{0F}$) of paths of length K for all states I,F=0, 1, ..., $2^K-1$ using Observation 2. The path metric $P_{IF}$ is chosen in the process of eliminating the least likely path A or B from a loop between state I and state F, and is given by $$P_{IF} = \min(P_{A,IF}, P_{B,IF}) = \frac{1}{2}(P_{A,IF} + P_{B,IF}) - \frac{1}{2}|P_{A,IF} - P_{B,IF}|$$

where subscript A refers to an upper path in the loop and subscript B refers to a lower path.

Therefore, $$P_{IF} - P_{0F} = \frac{1}{2}\sum_{k=0}^{K-1}(a_{IF,k}^2 + b_{IF,k}^2 - a_{0F,k}^2 - b_{0F,k}^2) -$$

$$\sum_{k=0}^{K-1}(a_{IF,k} + b_{IF,k} - a_{0F,k} - b_{0F,k})R_{T+k} -$$

$$\frac{1}{2}|P_{A,IF} - P_{B,IF}| + \frac{1}{2}|P_{A,0F} - P_{B,IF}|$$

where a or b with subscript k refers to the k-th branch label ($y_k$).

The first term on the right hand side of the above equation for $P_{IF}-P_{0F}$ is R-independent and can be pre-computed. The second term is independent of the final state F due to Observation 2. Therefore there is only $2^K$ different terms of this type. As in Step 1, it can be seen that there is a reduction in the complexity of computing $P_{IF}-P_{0F}$ for all paths (up to a factor of $2^K$) due to the existence of invariants of final state. The last two terms on the right hand side of the above equation for $P_{IF}-P_{0F}$ have been computed at step 1.

Step 3: Let $\Pi_i$ be the path metric of surviving paths at time T, i=0, 1, ..., $2^{K-1}-1$. Add $\Pi_i$ to all combinations, which have been computed during Step 2. Choose the path of highest likelihood out of $2^{K-1}$ paths converging to each final state. Add $P_{0F}$ to the state's survivor's difference metric to obtain the updated path metrics of all paths. Proceed to Step 1 at time T+K.

Step S407 of FIG. 7 is the process of calculating the second term in equation the above equation for $P_{IF}-P_{0F}$, which is dependent on the received data. This term is independent of the final state. In step S408, the last two terms of equation the above equation for $P_{IF}-P_{0F}$ are calculated. In step S409, the first term in equation the above equation for $P_{IF}-P_{0F}$ is calculated. Since the first term is independent of the received data, it may be pre-calculated, before the received data is known. Hence, on the flowchart, it is shown as being a side-branch of the process, and it could preferably be done any time before step S404, or otherwise any time before step S410. In step S410, the four terms of the above equation for $P_{IF}-P_{0F}$ are added together to obtain the branch metric difference $P_{IF}-P_{0F}$. Finally, in step S411 of FIG. 7, the survivor to state F at time T+K is found, given $P_{IF}-P_{0F}$ as found in S410, and the survivors' path metric $P_i$ at time T.

FIG. 8 is a diagram of apparatus for performing the method described in FIG. 7. This embodiment comprises logic blocks for performing the steps of the method.

In FIG. 8, the loop-erase block 502 performs step S407, calculating the path invariant term in the above equation for $P_{IF}-P_{0F}$. The result is passed to branch metric block 503. The branch metric difference block 504 uses the branch metric differences calculated by the loop-erase block 502, and calculates the last two terms of the above equation for $P_{IF}-P_{0F}$ which include the modulus of branch metric differences between paths in the loops, corresponding to step S408 in FIG. 7. The results are passed to the branch metrics block 503.

The branch metrics block 503 uses the pre-calculated first term of the above equation for $P_{IF}-P_{0F}$, calculated in step S409 of FIG. 7, and also uses the remaining terms in the above equation for $P_{IF}-P_{0F}$ which are supplied by the path invariants block 501 and the branch metric difference block 504. It uses these terms to calculate the branch metrics. This corresponds to S410, where branch metric differences are calculated, giving a relative comparison of the sizes of the branch metrics. It is, of course, not necessary to calculate branch metrics for eliminated branches. The branch metrics calculated by the branch metric block 503 are passed to the add-compare-select block 505. The process can then proceed as in either standard Viterbi algorithm, or the parallel adaptation of standard Viterbi.

Step 4: Accumulate the surviving paths in the trace-back unit and output the decoded data bits in accordance to the standard trace-back procedure of Viterbi algorithm, or the parallel adaptation of Viterbi algorithm.

In FIG. 8, the add-compare-select block 505 uses branch metrics calculated by the branch metric block to calculate path metrics and eliminate paths of highest path metric. The lattice can then be re-defined according to the parallel adaptation of Viterbi algorithm, as described with reference to FIG. 14, where the calculated path metrics become the new branch metrics. Hence the add-compare-select block 505 uses path metric feedback in the iterative process of elimination of the least likely paths within loops. The add-compare-select block 505 outputs the states of the surviving paths to the trace back block 506. The trace back block 506 uses this information, together with the information output by the loop-erase block 502, to determine the path with lowest path metric, and outputs this path to the user.

If backwards recursion version of Viterbi algorithm is used, it is possible to apply a similar process, but using observation 3 instead of observation 2 to simplify the computation of length K path metrics.

Radix $2^{2k}$ computation is now considered. An extra difficulty present in the computation of highest likelihood paths of length 2K is the presence of multiple paths of length 2K between a given initial state and final state. It is assumed that least likely paths of length K, which connect states at time T to states at time T+K and states at T+K to states at T+2K, have been eliminated. Then there are $2^{2K-2}$ loops of length 2K, where each such loop comprises $2^{K-1}$ paths (i.e. there are $2^{K-1}$ paths connecting each state at T to each state at T+2K).

In order to resolve these loops one needs therefore to compute $2^{3K-3}$ path metrics. However, Observations 2 and 3 imply that this computation has a much lower complexity: in order to eliminate least likely paths of length 2K, it is sufficient to know the path metric difference between path I-k-F and path I-0-F, which is $P_{Ik}+P_{kF}-P_{I0}-P_{0F}$ for all states I, k and F. Here $P_{ij}$ is the path metric of the highest likelihood path of length K from state i to state j. However Observations 2 and 3 combined together imply that R-dependent terms in $P_{Ik}+P_{kF}-P_{I0}-P_{0F}$ depend on neither I nor F. Hence there are only $2^{K-1}-1$ such terms to compute. Remaining terms are R-independent and can be easily pre-computed. Once all least likely paths of length 2K have been eliminated, the rest of the computation can be carried out in a way analogous to radix-$2^K$ computation.

If there is no correlation between the noise affecting each received signal then the noise is referred to as white, otherwise it is referred to as coloured. So far the discussion has centred on white noise. In the presence of coloured noise, the implementation of the maximum likelihood decoding or detection is modified.

Certain implementations result in modifications to the received signals before entering the detector/decoder and the use of a different generator polynomial. In such instances the structure of the maximum likelihood detector/decoder is unaltered and all observations made so far still hold.

Other implementations result in a detector/decoder that accepts an input signal that instructs the unit to change the generator polynomial being used. Once a generator polynomial has been selected however all previously made observations still hold.

One particular approach to treating coloured noise relies on processing blocks of received signals. This is demonstrated in the following example using length K. For white noise, a path metric with labels $(a_0, a_1 \ldots a_{K-1})$ and corresponding received signals $(R_0, R_1 \ldots R_{K-1})$ was:

$$P_A = \sum_{k=0}^{K-1}(a_k - R_k)^2 = (\underline{a}-\underline{R})^T(\underline{a}-\underline{R})$$

Here, for convenience, $\underline{a}$ and $\underline{R}$ are the vectors $(a_0, a_1 \ldots a_{K-1})$ and $(R_0, R_1 \ldots R_{K-1})$ respectively. To incorporate the fact that the noise is coloured, a K by K matrix C is introduced (note that C can be assumed to be symmetric) and the following path metric is used:

$$P_A = (\underline{a}-\underline{R})^T \underline{\underline{C}} (\underline{a}-\underline{R})$$

So $$P_A - P_B = (\underline{a}-\underline{R})^T \underline{\underline{C}}(\underline{a}-\underline{R}) - (\underline{b}-\underline{R})^T \underline{\underline{C}}(\underline{b}-\underline{R})$$
$$= (\underline{a}^T\underline{\underline{C}}\underline{a} - \underline{b}^T\underline{\underline{C}}\underline{b}) - 2\underline{R}^T\underline{\underline{C}}(\underline{a}-\underline{b})$$

If C is the identity matrix, which corresponds to white noise, then equation for $P_A - P_B$ above reduces to that for white noise. It is therefore sufficient to restate the initial observations with regard to the expression C(a-b):

Observation 4. Let $\underline{a}$ and $\underline{b}$ be the vectors of branch labels of the upper and lower paths of length K connecting any two states $S_I$ and $S_F$, subsequently referred to as branch vectors. Then, the vector of differences of these labels is independent of $S_I$ and $S_F$ $$\underline{\underline{C}}(\underline{a}-\underline{b}) = \underline{\underline{C}}\underline{g}$$

Where g is the vector of coefficients of the generator polynomial. Observation 1 can be applied to decide the shortest path out of all paths forming loops of length K as before. Thus loop invariants survive in this presence of coloured noise case.

Observation 5 (Invariants of the final state) Consider two paths, which converge to a given state $S_F$. Assume that the first path originates from state $S_I$, and the second path originates from state 0. Let $\underline{a}$ and $\underline{b}$ be the branch vectors of paths from $S_I$ and 0 correspondingly. Then $$\underline{\underline{C}}(\underline{a}-\underline{b}) = \underline{\underline{C}}\underline{f}(S_I)$$

Where $\underline{f}$ is a vector, which depends on the initial state $S_I$, but not on the final state $S_F$. If the paths each have length less than the constraint length K, then $f(S_I)$ is independent of the paths. If the length of each path is equal to the constraint length K, then $f(S_I)$ depends on both the initial state $S_I$ and also on whether an upper-upper, upper-lower, lower-upper or lower-lower path combination was chosen. If the paths have a length which is larger than the constraint length, then $f(S_I)$ becomes dependent on the actual paths chosen, as well as on the initial state $S_I$. It is not essential for the other initial state to be a zero state, as it could alternatively be any other fixed state.

Observation 6 (Invariants of the initial state) Consider two paths, which originate from a given state $S_I$. Assume that the first path terminates at a state $S_F$, and the second path terminates at state 0. Let $\underline{a}$ and $\underline{b}$ be the branch vectors of paths terminating at $S_I$ and 0 correspondingly. Then $$\underline{\underline{C}}(\underline{a}-\underline{b}) = \underline{\underline{C}}\underline{h}(S_F)$$

Where $\underline{h}$ is a vector, which depends on the final state $S_F$, but not on the initial state $S_I$. If the paths each have length less than the constraint length K, then $h(S_F)$ is independent of the paths. If the length of each path is equal to the constraint length K, then $h(S_F)$ depends on both the final state $S_F$ and also on whether an upper-upper, upper-lower, lower-upper or lower-lower path combination was chosen. If the paths have a length which is larger than the constraint length, then $h(S_F)$ becomes dependent on the actual paths chosen, as well as on the final state $S_F$. It is not essential for the other final state to be a zero state, as it could alternatively be any other fixed state.

These observations allow for an analogous computation of the shortest path, but this time with the presence of coloured noise.

In a co-pending application, filed on the same date as the present application and entitled "A Maximum Likelihood Detector", a method of reducing a trellis using a modified, parallel version of VA is described, which application is hereby incorporated by reference. In some embodiments of the invention, this parallel version of VA is used to determine a path of maximum likelihood through the trellis.

Figure 9:
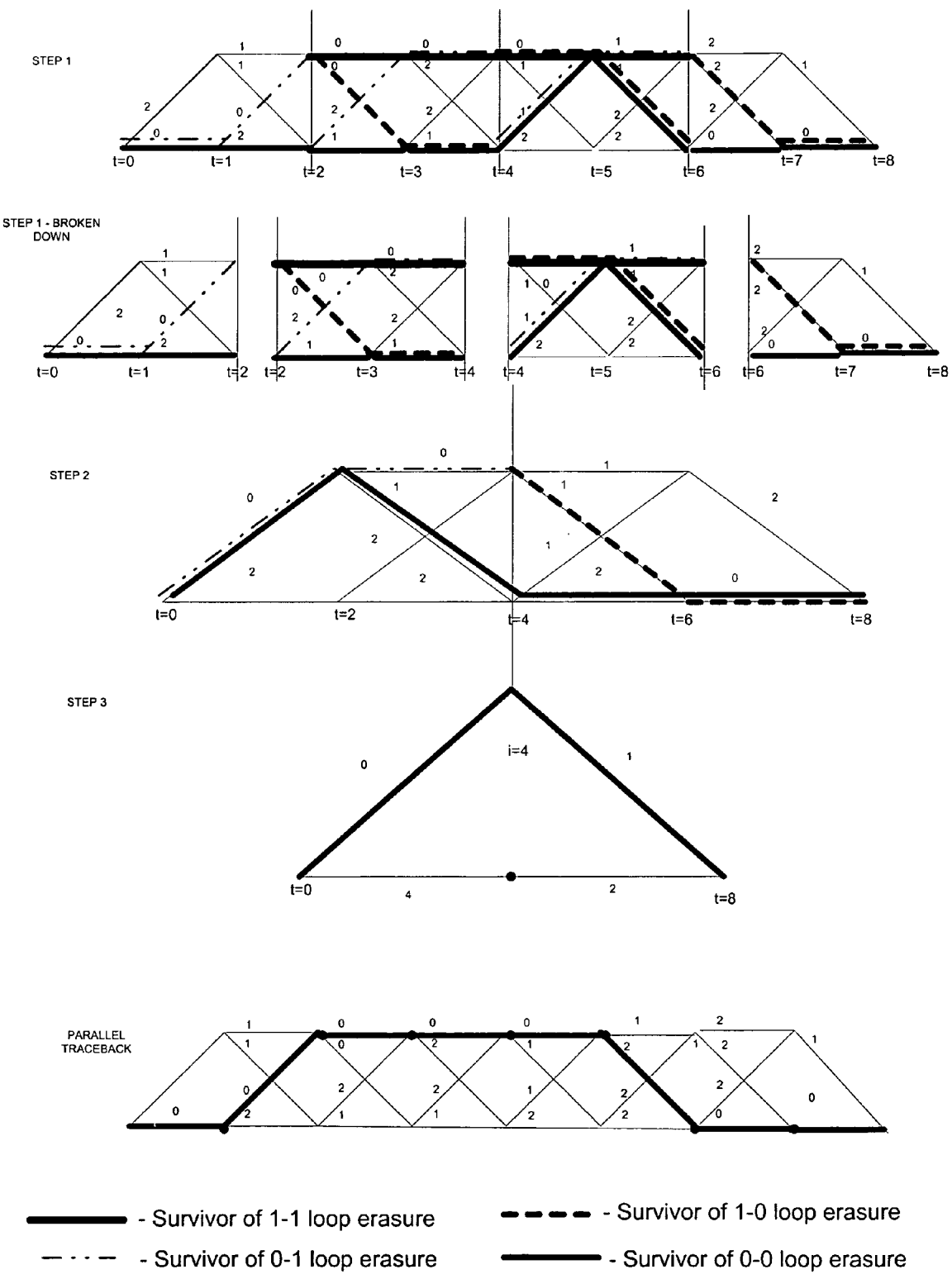
FIG. 9 is a series of trellis diagrams representing a series of steps in the decoding process, according to a parallel adaptation of the Viterbi method.

An example of the parallel VA method from the co-pending application is illustrated in FIG. 9. In the example, three steps are used to reduce the trellis. A trace-back process is used to determine the most likely path. The method is based on the assumption that there are two or more paths leading from state S(T) to state S(T+k), where k is an integer depending on the trellis structure, thus these two or more paths form a loop. The highest likelihood path passing through the states S(T) and S(T+k) will necessarily go through the most likely path out of these two or more paths. All paths forming a given loop can be analysed, the highest likelihood one chosen and all other paths discarded. This procedure is called loop erasure. Different loops can be eliminated independently thus allowing multiple loop erasure in parallel.

A fully parallel algorithm of finding the highest likelihood path on a trellis, which is based on loop erasure can be organised as follows.

Divide the trellis into the smallest time slices such that any state at the beginning of the slice is connected to any state at the end of the slice via a loop.

Eliminate multiple paths to erase all loops in all slices of the trellis in parallel. The result is a new trellis, which is $k_{min}$-times shorter than the original trellis, where $k_{min}$ is the length of time slices containing loops of minimal length. Branches of the new trellis are labelled by the lengths (path metrics) of paths of length $k_{min}$, which survived loop erasure.

Repeat the above steps I and II until the trellis consisting of a single loop is obtained. Erasing of this loop produces the highest likelihood global path on the original trellis.

Note that loop erasure in each section of the algorithm is performed independently in each time slice. Therefore, it can be performed in parallel. Due to the fact that erasure of all loops in a trellis results in a new trellis, which is at least two times shorter than the original one, the algorithm described above finds the highest likelihood path after at most $\log_2(N)$ repetitions of steps I, II. Here N is the length of the original trellis.

Figure 3:
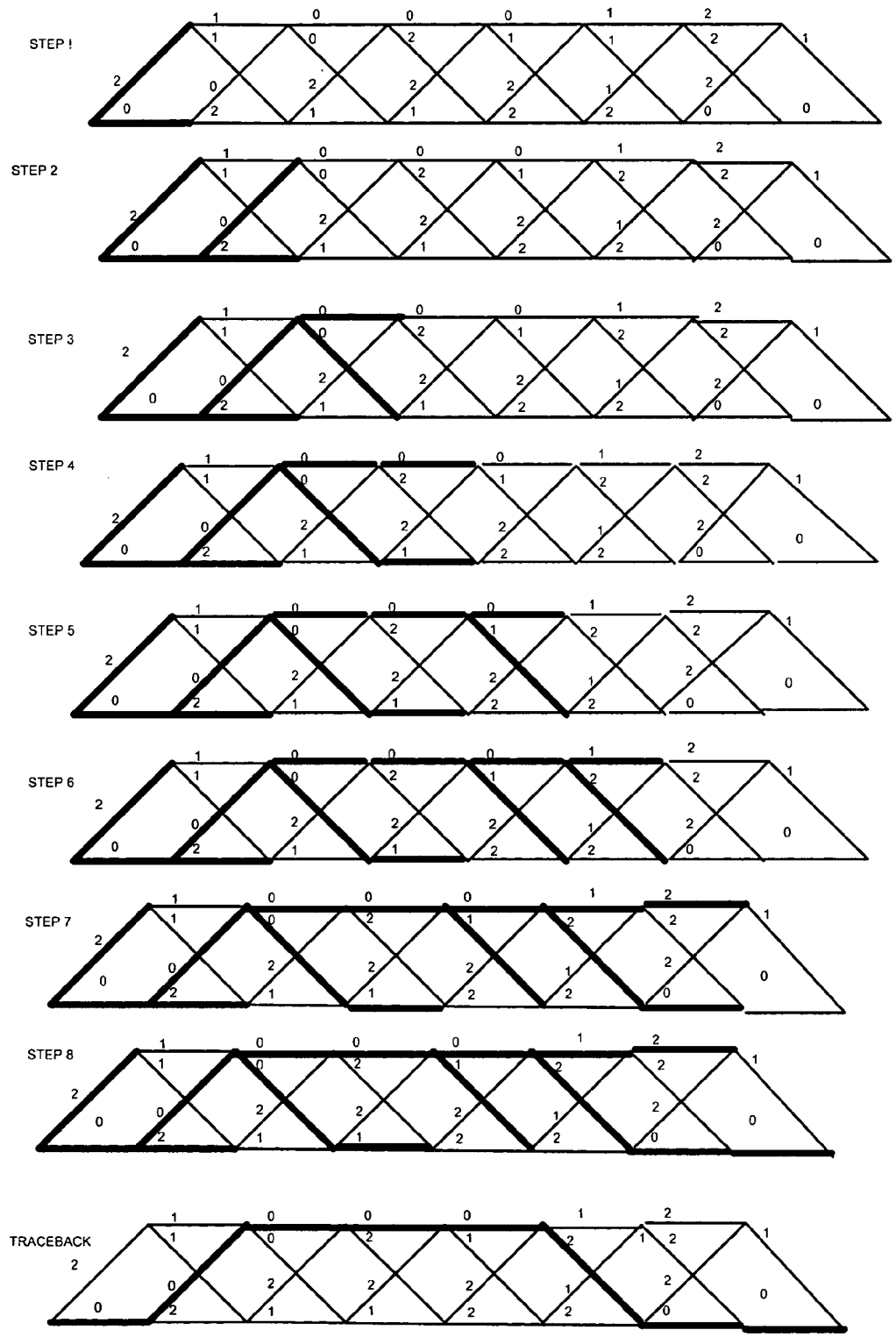
FIG. 3 is a series of trellis diagrams representing a series of steps in a Viterbi decoding process, according to the prior art.

Mathematically, the loop-erase algorithm relies on the factorisation of the space of all paths on a trellis into a direct product of spaces of loops on the trellis. FIG. 9 shows the application of loop erase algorithm to finding the highest likelihood path on the trellis which was analysed in FIG. 3 using VA. Notice the reduction in the number of steps LEA needs to find the highest likelihood path compared with VA.

The first trellis of FIG. 9 corresponds to the first step in the loop erase process. As in the case of FIGS. 1 and 3, the trellis is a two-state trellis, and it both starts and ends on state zero at time intervals t=0 and t=8 respectively. As in the example of FIG. 3, the branch metrics which are indicated for each path at each time interval may be calculated by taking the square of the difference between the received signal and the expected noise free signal for that path. Again, for the sake of clarity, actual calculated values are not used, but a small integer has been selected for each branch metric.

The first stage of reduction involves dividing the trellis into sections of length K, where K is the constraint length of the encoder, which is equal to the minimum guaranteed loop length. In this example, K=2, because each bit passing through the encoder can influence the encoder output over a length of two output bits, i.e. once when it is added to the delay element contents, and again when it is the delay element contents. Thus, the trellis is divided into sections each having two state changes. Since the trellis has a total of eight state changes, it is divided into four parts.

The second trellis diagram of FIG. 9 shows the trellis of step 1, divided into four parts. Each of the four parts of the trellis may now be dealt with in parallel, thus speeding up the decoding process. Each part of the trellis has a loop made up of two different paths connecting each initial state to each final state. One path in each loop can be eliminated by comparing the path metrics of the two paths. Thus, in the first part of the trellis, the first loop consists of paths 000 and 010, and the path metrics (calculated in the same way as in FIG. 3) are 2 and 3 respectively. Thus, the 010 path can be discarded. Similarly, the second loop has paths 001 and 011, with path metrics 0 and 3 respectively. Thus, the 011 path can be discarded.

The path reduction of the first part of the trellis is identical to standard VA. However, instead of reducing the first part of the trellis and then proceeding serially through the rest of the trellis, in this embodiment of the invention all four parts of the trellis are reduced in parallel.

The second part of the trellis has paths 000, 010, 001, 011, 100, 110, 101, 111, with branch metrics 2, 4, 3, 2, 1, 2, 2 and 0 respectively. The paths 010, 001, 110 and 101 can therefore be eliminated, as they have higher path metrics than the other paths in the same loops. The survivors are therefore 000, 010, 100 and 111.

The third part has paths 000, 010, 001, 011, 100, 110, 101, 111, with branch metrics 4, 2, 4, 2, 3, 1, 3 and 1 respectively. The paths 000, 001, 100 and 101 can therefore be eliminated, as they have higher path metrics than the other paths in the same loops. The survivors are therefore 010, 011, 110 and 111.

The fourth part has paths 000, 010, 100, 110, with branch metrics 0, 3, 2 and 3 respectively. The paths 010 and 110 can therefore be eliminated, as they have higher path metrics than the other paths in the same loops. The survivors are therefore 000 and 100.

After step 1, there is still a trellis with multiple paths, but the new trellis has only half the number of paths as the original trellis. The new trellis can be re-drawn with only the remaining paths, as shown at step 2. The branch metrics of the new trellis correspond to the path metrics of the surviving paths of the original trellis. Each time interval of the new trellis, shown in step 2, corresponds to two time intervals of the original trellis, shown in step 1.

The process of dividing the trellis into sections is now repeated for the new trellis, i.e. dividing the trellis into two parts, each part corresponding to a sequence of three trellis states, with two state transitions.

The first part of the trellis of step 2 has paths 000, 010, 001, 011 with branch metrics 4, 1, 4 and 0 respectively. The paths 000 and 001 can therefore be eliminated, as they have higher path metrics than the other paths in the same loops. The survivors are therefore 010 and 011.

The second part of the trellis of step 2 has paths 000, 010, 100, 110, with branch metrics 2, 3, 1 and 3 respectively. The paths 010 and 110 can therefore be eliminated, as they have higher path metrics than the other paths in the same loops. The survivors are therefore 000 and 100.

The process of dividing the trellis into sections is now repeated for the new trellis, i.e. dividing the trellis into two parts, each having two state transitions. The trellis can be redrawn, including only the remaining paths from the trellis of step 2. Each time interval on the new trellis corresponds to two time intervals of the trellis of step 2, and the branch metrics correspond to the paths metrics of the surviving paths from the trellis of step 2.

As all other paths have now been eliminated, the trellis of step 3 only has two paths 000 and 010, with branch metrics 6 and 1 respectively. The path 000 can therefore be eliminated, as it has the higher path metric in the loop. The single survivor is therefore 010.

The path metric of the single surviving path is now known, and has a value of 1, and the state at time t=4 from step 3 is now known, but it is necessary to trace back to find the path at each intermediate time t. This is done using a trace-back unit.

During the processing of step 1, the surviving paths were stored in a path memory. Some of these surviving paths were eliminated by step 2, leaving only two paths. One of these two surviving paths was eliminated by step 3, leaving only one path. That path can be retrieved from memory to output the result.

Figure 10:
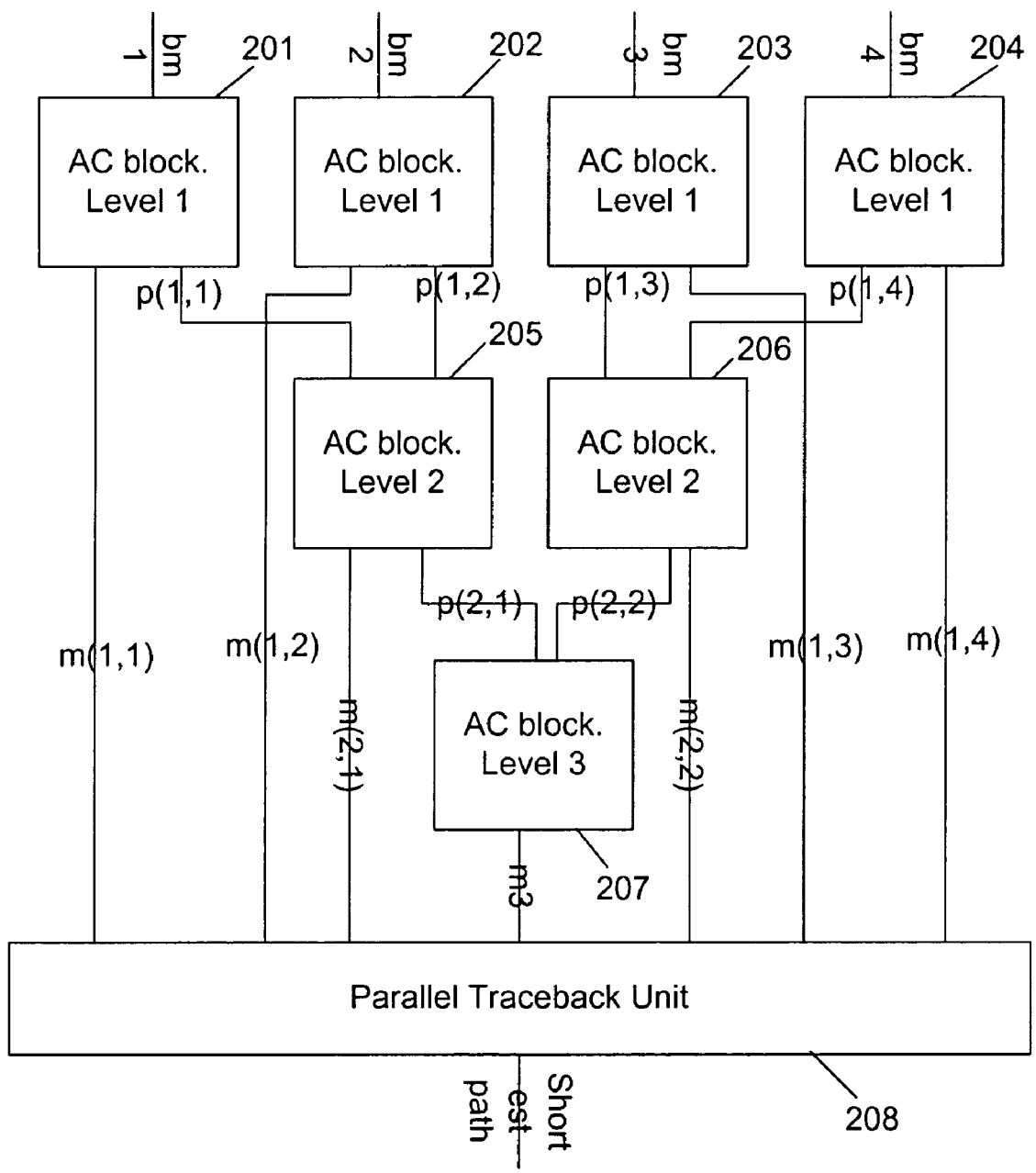
FIG. 10 is a block diagram of a decoding apparatus, using parallel decoding techniques.

FIG. 10 shows a block diagram of a parallel detector according to the first embodiment of the invention. The parallel detector has a set of four first-level add-compare (AC) blocks 201, 202, 203, 204, a set of two second-level AC blocks 205, 206, and a single third-level AC block 207.

First-level add-compare blocks 201, 202, 203, 204 compute path metrics of all paths on the original trellis constituting loops of minimal length, and then erase these loops by deleting the least likely path in each loop. They output path metrics $p_1$'s and binary codes $m_1$'s of paths, which survived loop erasure. Each of the four first-level blocks has an input for receiving one set of branch metrics, bm1, bm2, bm3 or bm4, for one of the four sections of the trellis. It then calculates the path metrics for that section of the original trellis, using the branch metrics. The path metrics p(1,1) and p(1,2) from the first 201 and second 202 AC blocks respectively are input to a second level AC block 205. Similarly, the path metrics p(1,3) and p(1,4) calculated by the third 203 and fourth 204 blocks respectively are input to a further second level AC block 206.

Add-compare blocks of second-level accept path metrics from the first-level as inputs. These path metrics play the role of branch metrics for the reduced trellis. Add-compare blocks of level two compute path metrics of paths constituting minimal loop on second-level trellis and erase loops. They output path metrics $p_2$'s and binary codes $m_2$'s of surviving paths. The second level AC blocks calculate the path metrics for the reduced trellis of step 2 in FIG. 3. The path metrics p(2,1) and p(2,2) from the two second level AC blocks 205, 206 are input to a third level AC block 207.

Add-compare block of third-level accepts path metrics from second-level as inputs. These path metrics play the role of branch metrics for the reduced trellis of third-level. Add-compare block of third-level computes path metrics of paths constituting minimal loop on third-level trellis and erases this last loop. It outputs binary codes $m_3$ of the surviving path. The third level block reduces the two-path trellis of step 3 in FIG. 9, leaving a single path. During the calculation at each level, the path data is sent from each of the blocks to a parallel trace-back unit 208, which reconstructs the highest likelihood path, and outputs this information.

Parallel trace back unit inputs binary codes of surviving paths $m_1$, $m_2$ and $m_3$. Using the structure of binary comparison tree it determines the sequence of states (or a decoded message in case of applications to communication) describing surviving path in $O(\log_2(N))$ steps. Alternatively, it is possible to use a different type of tree structure such as a tertiary tree or an asymmetric tree structure.

Figure 11:
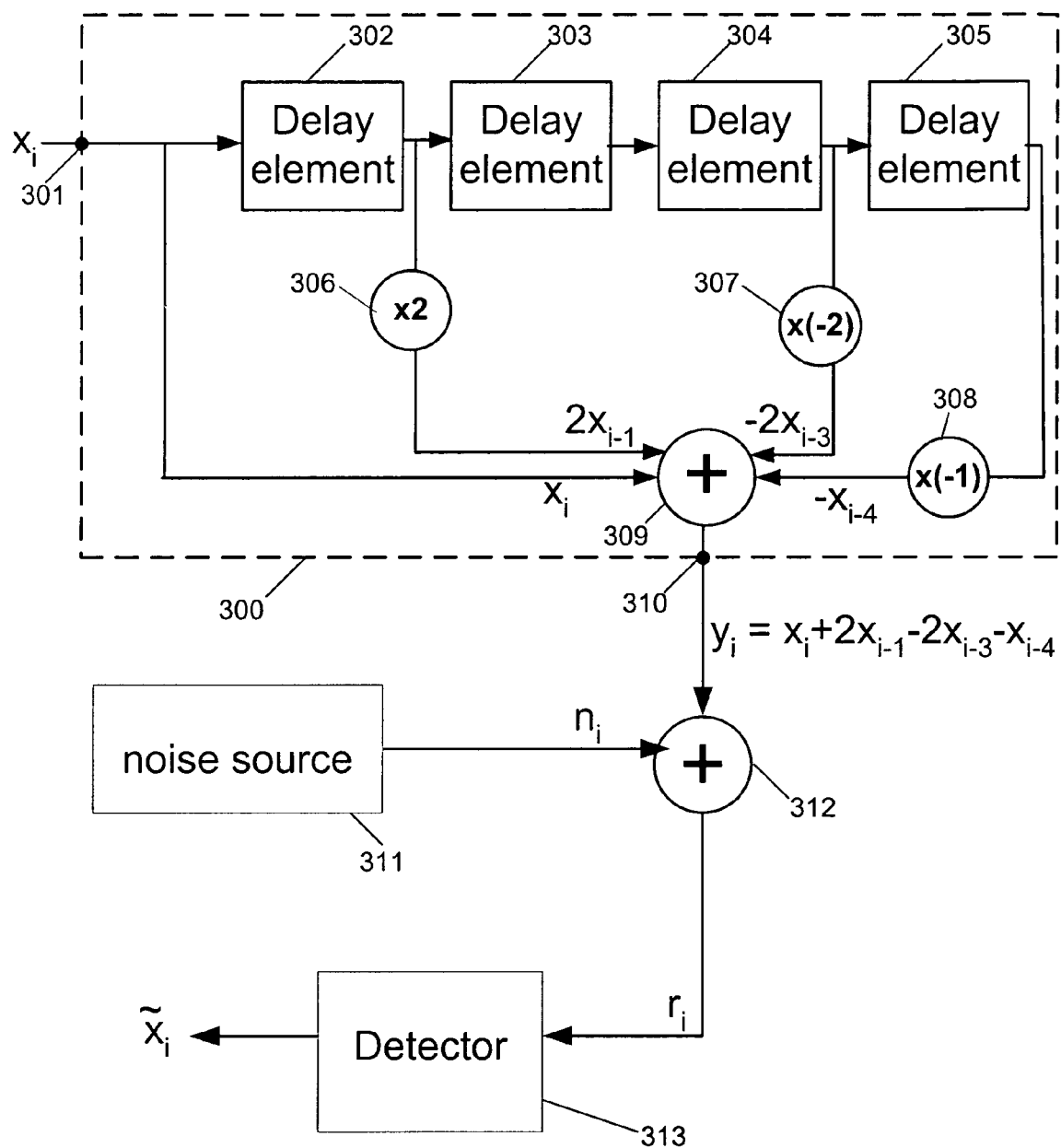
FIG. 11 is a block diagram of a convolution encoder which represents a E2PR4 hard disk reading process.
Figure 12:
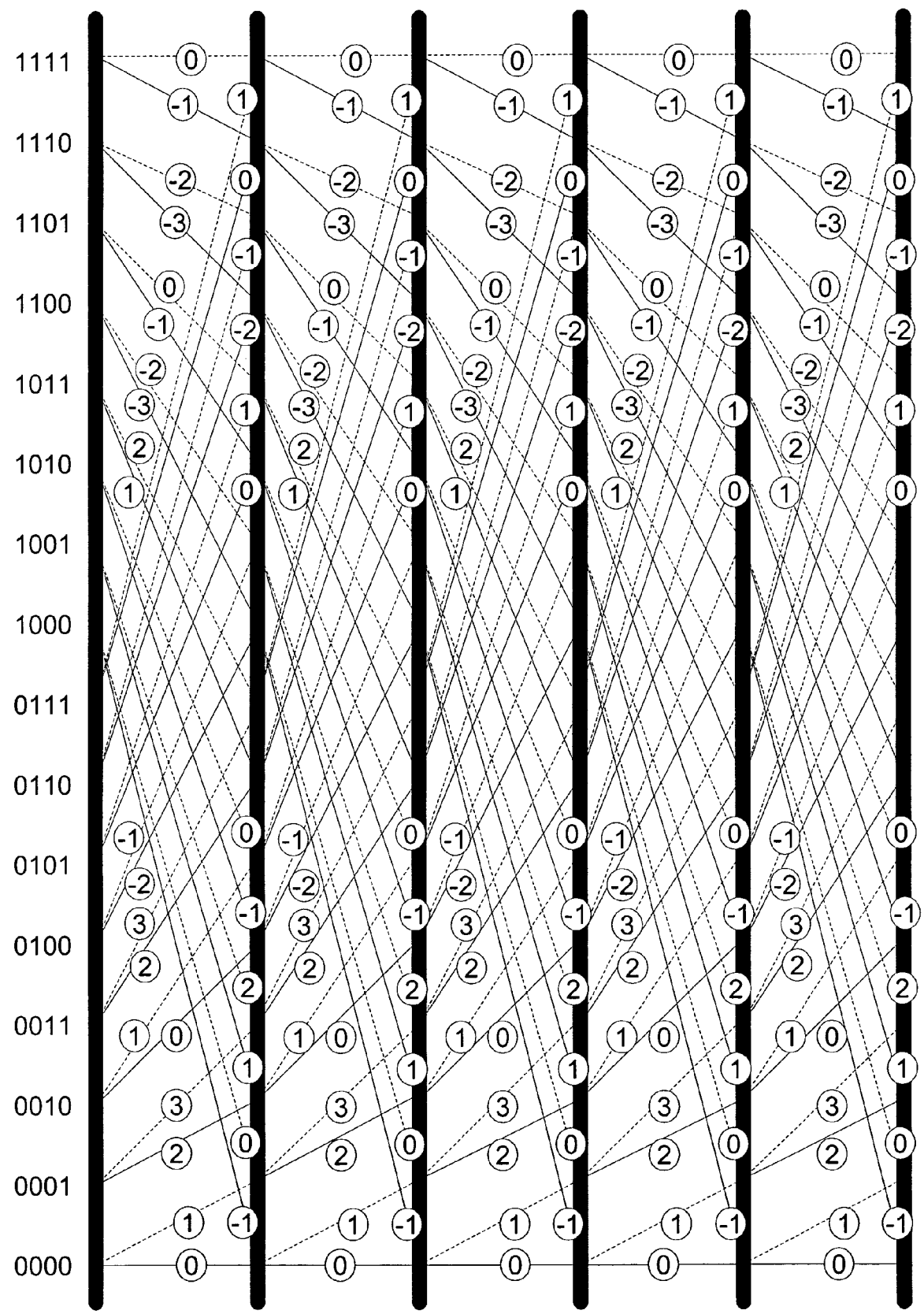
FIG. 12 is a trellis diagram for the encoder of FIG. 11.

FIGS. 11 and 12 respectively show a block diagram of a E2PR4 encoder, and a corresponding trellis diagram. E2PR4 encoders are more complicated than 1-D encoders and PR4 encoders because the constraint length K is larger. For example, in hard disk read systems, E2PR4 may give a more accurate model of the read process for high density storage of data bits on a disk, where the magnetic fields of several neighbouring bits on either side of a given data bit will significantly affect the read process. In the E2PR4 example now given, the constraint length K is five.

Figure 2A:
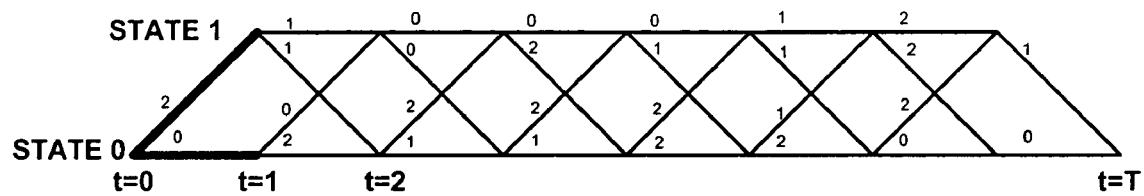
FIGS. 2A and 2B show an example of a trellis diagram representing a two-state time dependent process as known in the prior art.
Figure 2B:
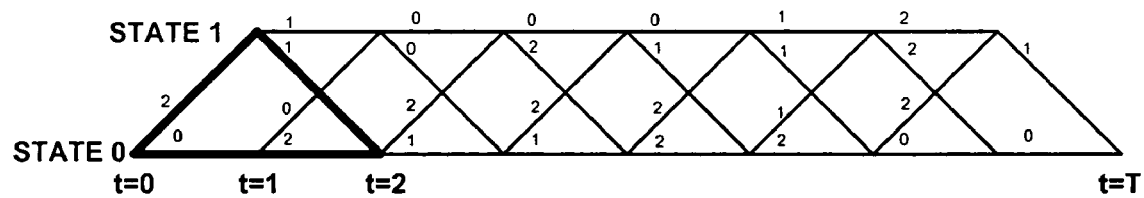

FIG. 11 shows a block diagram of the E2PR4 encoder 300, a transmission channel, and a detector 313. As in FIG. 2, a noise source 311 represents the effect of noise during transmission of the data.

The encoder has an input $x_i$ and four delay elements 302, 303, 304, 305 arranged in a pipelined structure such that input data passed from one delay element to the next at each clock cycle. The input $x_i$ connects to the input of the first delay element 302. The output of the first delay element 302 is passed to the input of the second delay element 303. The output of the second delay element 303 is passed to the input of the third delay element 304. The output of the third delay element 304 is passed to the input of the fourth delay element 305.

The delay elements 302, 304 and 305 are also arranged to output via multiplication units 306, 307 and 308 respectively, to a sum unit 309. Multiplication unit 306 multiplies the output of delay element 302 by two. Multiplication unit 307 multiplies the output of delay element 304 by minus two. Multiplication unit 308 multiplies the output of delay element 305 by minus one. The input $x_i$ is also connected to the sum unit 309. Thus, the sum unit calculates an output $y_i = x_i + 2x_{i-1} - 2x_{i-3} - x_{i-4}$. Due to having this form of output, the encoder 300 has a generator polynomial $G(D) = 1 + 2D - 2D^3 - D^4$.

Figure 1:
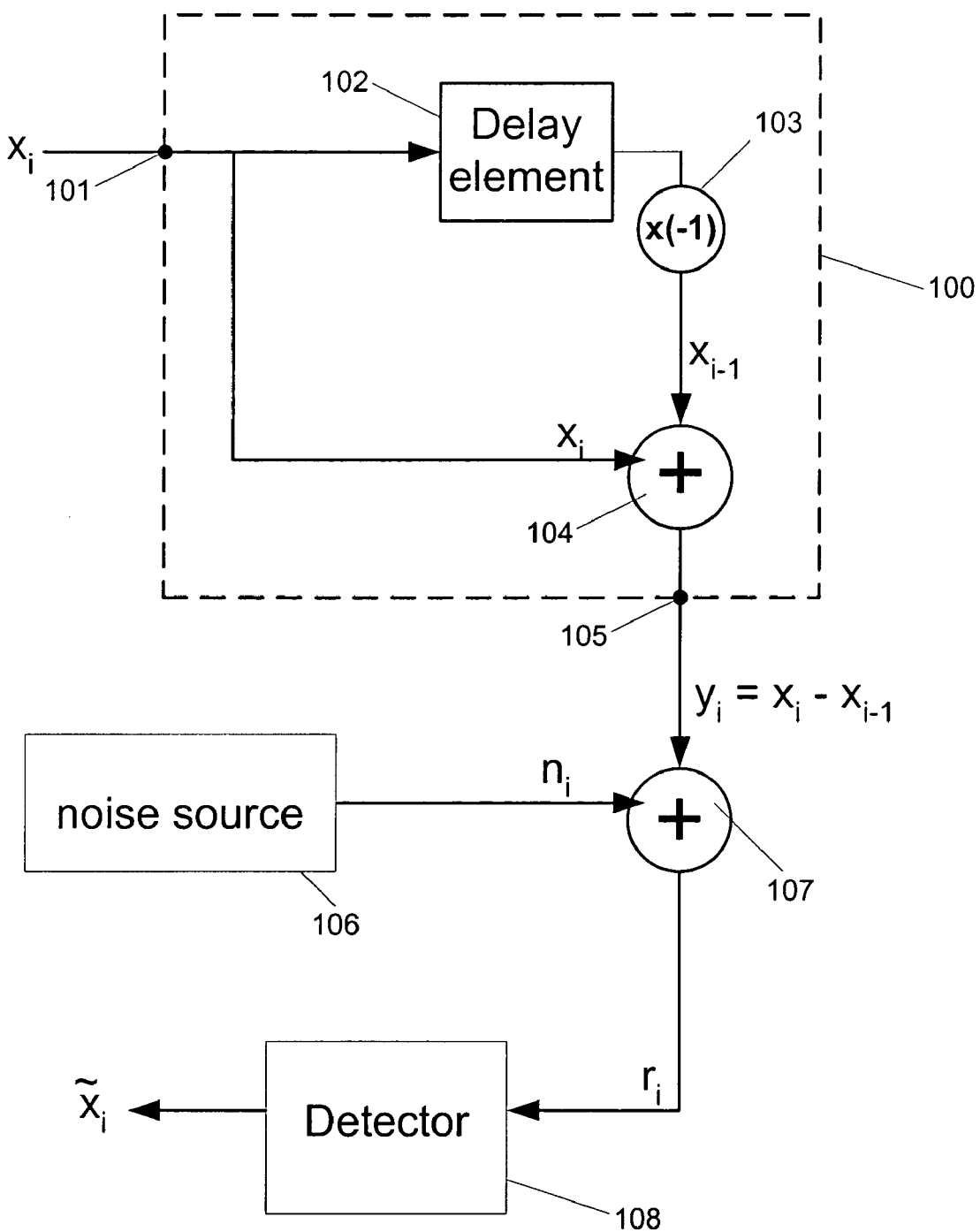
FIG. 1 is a block diagram of an apparatus for convolution encoding and decoding of data, according to the prior art.

As in FIG. 1, the encoder output signal $y_i$ is sent from the output 310 of the encoder 300 via a channel, such as a radio link, a wire, or any other form of data transmission channel, to a detector 313. Noise source 311 represents noise $n_i$ generated as the signal $y_i$ passes through the channel. The noise source may generate Gaussian white noise, but the actual form of the noise generated does not have to be Gaussian, although in this example, it must be de-correlated noise. A sum unit 312, with inputs connected to the noise source 311 and the encoder output 310, represents the addition of the noise $n_i$ to the data $y_i$. Thus, the signal received after the data has passed through the noisy channel is $r_i = y_i + n_i$. The detector 313 receives the signal $r_i$, and the detector then performs a decoding process.

The trellis diagram for a E2PR4 system is shown in FIG. 12, and has 16 states, which correspond to the 16 possible combinations of zeros and/or ones in the four delay elements of FIG. 11. Thus, each state is a four digit binary number, with the four bits corresponding to the past encoder inputs of $x_{i-1}$, $x_{i-2}$, $x_{i-3}$ and $x_{i-4}$. When a new data bit is received by the encoder, the previous data input bit is stored in the first delay element, and the bits in the delay elements are all shunted forwards by one delay element. Thus, for example, a state of 0000 may change either to a state 0000 or a state 0001, depending on whether the new data bit is a zero or a one respectively. Similarly, a state of 1110 may change to either 1100 or 1101.

A dashed line on FIG. 12, connecting a state at time t-i to a state at the following time interval t, represents a new encoder input $x_i$ of one, and an unbroken line represents a new encoder input $x_i$ of zero.

The numbers shown on each dashed or unbroken line of FIG. 12 are not branch metrics, but branch labels $y_i$, indicating possible ideal encoder output values. For example, the branch label 0 is shown on the line connecting state 0000 at time T=0 to state 0000 at T=1. This branch label is calculated according to the generator polynomial $G(D) = 1 + 2D - 2D^3 - D^4$. This generator polynomial results in an encoder output of $y_i = x_i + 2x_{i-1} - 2x_{i-3} - x_{i-4}$. Thus, for state 0000, $x_{i-1} = 0$, $x_{i-2} = 0$, $x_{i-3} = 0$ and $x_{i-4} = 0$. The line from 0000 to 0000 is a solid line rather than a dashed line, thus it represents a new encoder input bit with a value of zero, i.e. $x_i = 0$. Thus, to calculate $y_i$, the above values of $x_i$, $x_{i-1}$, $x_{i-3}$ and $x_{i-4}$ are used. This produces a value of $y_i=0$. $x_{i-2}$ is not needed, since this term has no direct output to the encoder sum unit 309, and has a zero coefficient in the polynomial for $y_i$.

To give a further example, the branch label from state 0001 at time T=0 to state 0011 at time T=1 is 3. This is calculated using 0001 for i−1 to i−4, i.e. $x_{i-1}=1$, $x_{i-2}=0$, $x_{i-3}=0$, $x_{i-4}=0$. The new encoder input $x_i$ is 1, which is represented as a dashed line on the trellis. Thus, $y_i=1+2-0-0=3$.

A loop is formed when two different paths connect the same initial and final states. Thus, K (which is equal to 5) state changes are needed to form a loop in a E2PR4 system, because if the delay elements start in the same state for both paths, and the first new bit is different for each path, it then takes a further four bits which are the same in each path in order to "flush" the delay elements, and once again, have identical delay element contents.

When a loop is formed between time T=0 and time T=5, the initial values of $x_{i-1}$, $x_{i-2}$, $x_{i-3}$, $x_{i-4}$ are identical for each path in the loop at time T=0, because both paths in the loop start at the same state. However, the value of $x_i$ is 1 for the "upper path" and 0 for the "lower path". Thus, the difference in branch labels $y_i$ between the two paths is dependent only on the coefficient of $x_i$ in the equation $y_i=x_i+2x_{i-1}-2x_{i-3}-x_{i-4}$. Similarly, at time T=1, only $x_{i-1}$ differs between the two paths, thus the difference in branch labels during this time interval depends only on the coefficient of $x_{i-1}$, in the equation for $y_i$. A similar pattern follows for the remaining time intervals. This corresponds to "Observation 1", in which the branch label difference equals the corresponding generator polynomial coefficient.

Figure 13:
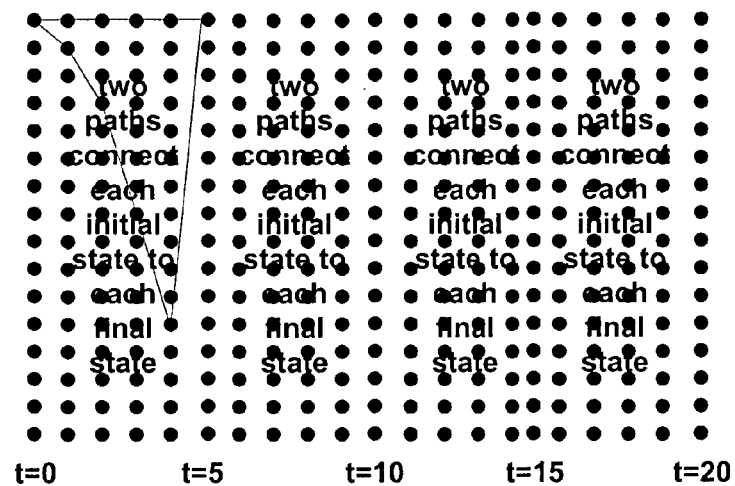
FIG. 13 shows partially connected trellis diagrams for three steps in the reduction of an E2PR4 trellis.
Figure 13:
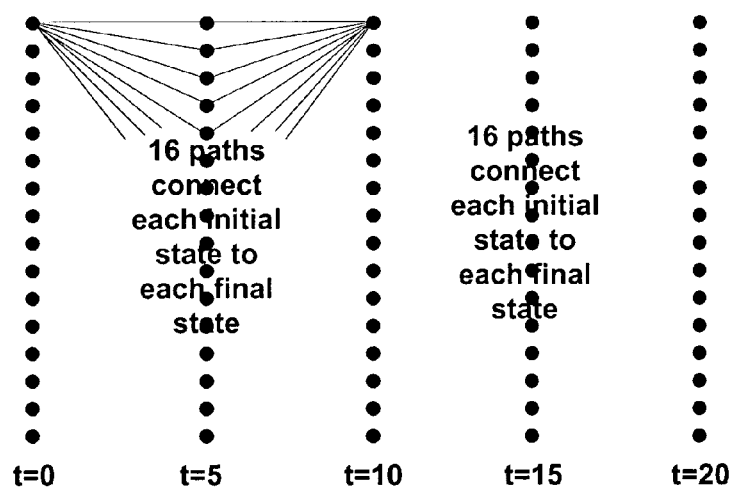
Figure 13:
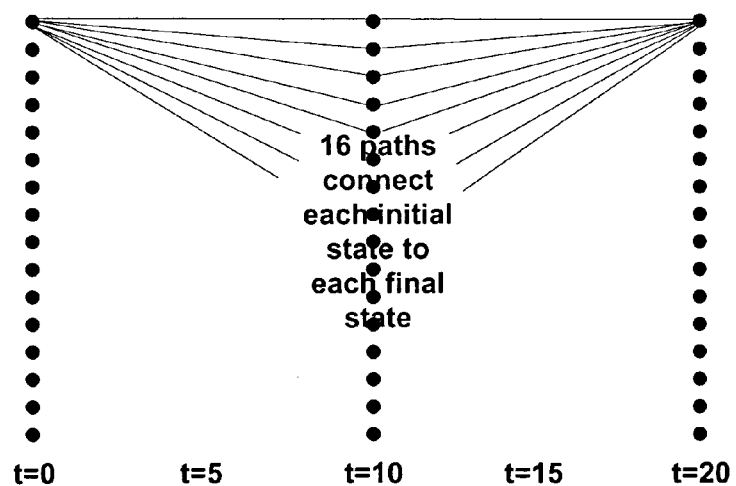

As shown in the upper part of FIG. 13, the trellis is divided into sections, each section corresponding to an initial state followed by five new encoder input states. Exactly two paths connect each state at the beginning of a section to each state at the end of the section. One of each of these pairs of paths is then eliminated within each section, using VA. The trellis may then be re-drawn, as shown in the middle part of FIG. 13, omitting the discarded loops. The new trellis has 16 states, each of which has a single path to the following state. Thus, the new trellis differs from the original trellis in that 16 different paths are possible linking any state to the next state, instead of the two paths linking adjacent states in the original trellis diagram. Thus, in the reduced trellis diagram, loops can be constructed after only two steps. Therefore, to further divide the trellis, it is necessary to split the reduced trellis into sections of length two.

These subdivided sections are reduced for all loops using VA and the trellis is again redrawn, as shown in the bottom part of FIG. 13. The process of dividing the trellis, loop erase, and redrawing the trellis is repeated iteratively, until a trellis with only a single path is left. During each step of the process, each part of the trellis may be processed in parallel.

In reality, it is often preferable to send continuous data streams, rather than to keep inserting re-set characters to clear the contents of the encoder delay elements. The prior art method known as continuous VA or sliding-window VA can be used for this purpose, and will now be described. Embodiments of the present invention may be used to facilitate the calculation of path metrics in sliding-window VA.

Sliding window VA deals with continuous data by running a standard VA process in an operating window of length W. Within the window, for every state at time T (the most recent time) and for every state at time T−W, VA finds the path of greatest likelihood that connects these two states. Once the greatest likelihood paths connecting each pair of states are calculated, the operating window is advanced forward by W bit cycles, and the trace-back is performed from the time T to T−W−P. The last W samples in the path memory window are outputted to the user.

Although standard VA commonly uses a knowledge of both the start and end states to fully reduce a trellis, sliding-window VA does not require any knowledge of the start and end states. Instead, sliding window VA makes us of the fact that after a sufficiently long time interval, the most likely path will become effectively independent of the initial state. Thus, a set of paths of highest likelihood, each starting at a different possible state at time T, will tend to converge to a single path after a sufficiently long time period, because the initial state no longer has a significant influence on the encoder output at this time. The same principle holds in reverse, i.e. a backwards convergence of paths occurs after tracing back for a sufficiently long time period. In general, when the probability P is very close to 1, all survivors at time T originate from the same survivor at time T−D, where D is the survivors' depth, which in general is approximately five times the constraint length. In this example, the paths can be assumed to converge within a length of 2W from the final state.

For certain timing processes, such as transmission of control signals back to the data transmitter, it is necessary to get "early" bit decisions. For example, if the detector needed to request data to be re-sent, due to excess noise, it would be necessary to generate the request, and set up the detector accordingly.

It can be assumed, for the purposes of obtaining an early decision, that the paths will converge closer to the output bit than many of them actually do, so that trace-back of the paths can be performed in less time. The result is not as accurate, and sometime, a non optimal path will be selected. However, it provides a working result, allowing time-critical control processes to function without delay. In other words timing circuits get an approximate answer provided quickly, but the user gets a better quality answer provided after a longer time delay. In a typical application, a read channel uses "early decisions" after approximately 15 bits rather than the approximately 40 bits used for data output.

As a result, the timing loop gets decisions that are accurate (e.g. the bit error rate, BER=1E-3) enough for it to run with low latency of 15 bits, since the loop latency is critical for timing recovery. And the read channel outputs the more accurate bits (e.g. BER=1E-6) to the user with higher latency.

Figure 14:
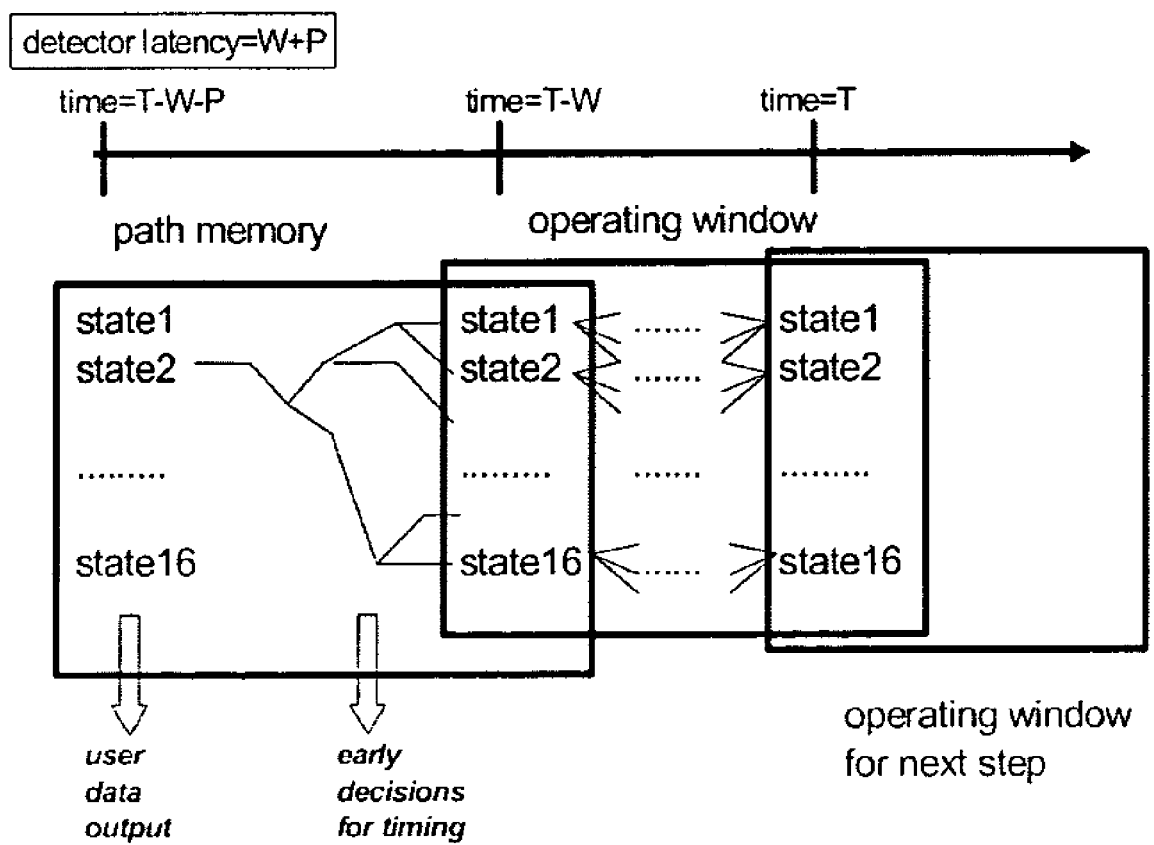
FIG. 14 is a schematic diagram illustrating a method of sliding-window Viterbi decoding, to which embodiments of the invention may be applied.

FIG. 14 shows a schematic diagram of a sliding-window VA detector. It is known to use this detector together with a standard VA process. However, the sliding-window VA process may be used in embodiments of the present invention.

The arrow pointing left to right at the top of the figure illustrates a time axis. A first processing window is shown, enclosed in a box with dashed outline, and beginning at time T−W−P and ending at time T−W. An operating windows of length W is shown as a box starting at time T−W and ending at time T. A dotted line shows the position of the next operating window, not actually yet used in this example, starting at time T and ending at time T+W.

Within the operating window from time T−W to time T, part of a trellis is represented, with 16 initial states and 16 final states. This part of the trellis can be reduced using standard VA, to obtain a single path connecting each initial state to each final state. To find which initial state should be selected out of the 16 initial states, it is necessary to look back to the part of the trellis between time T−W−P and T−W. The final state in this section of the trellis is not yet known. However, by retracing the path from T−W backwards, it is found that the most likely paths for each state at T−W will converge after a certain number of steps. Thus, the path can be found at times earlier than that point of convergence, and a branching path is left after that point of convergence. The state at time T−W can be found by moving the process on to the next operating window, such that the convergence occurs at a later time. The latency W+P of the detector is the delay between the data being received at time T for processing in an operating window, and a previous time To, for which the state at time T has no effective influence on the most likely path prior to time To.

To perform continuous decoding, the standard Viterbi algorithm may be used, or alternatively, the previously described parallel adaptation of Viterbi algorithm may be used.

In the following specific example, two 5×16 blocks are taken and made to work in parallel to determine 256 highest likelihood paths of length 10 from any initial state at T to any state at T+10. After this computation each state at T+10 is connected to all 16 states at T. As path metrics of highest likelihood paths to all states at T is known, path metrics can be computed for 16 paths coming to each state at T+10 and the highest likelihood can be found using binary tree of comparisons. Thus there are 16 add-compare blocks which reduce 256 paths to 16. This design consists of three stages, where only the last one needs the knowledge of path metrics. Each stage is about 2 ns long. This design can be very naturally pipelined—the computation in a new window can start before the computation of the updated path metric is finished.

The trace back path of this design is very similar to a standard Viterbi, but there is a simplification, due to the fact that embodiments of the invention choose paths in chunks, so one needs to store less info about survivors: instead of 11 states crossed by the path, it is necessary to know the first state, final state and whether upper part of the loop has been chosen (code 1) or lower part of the loop has been chosen (code 0).

The present invention is not limited to radix-2, and may also include radix 4, radix 8, radix 16, radix 32 and other values of the radix. Embodiments of present invention include maximum likelihood detectors for detecting data with constraint length equal to K=2 or greater.

Although embodiments described have all used hard inputs and hard outputs, it is also possible to use the invention with soft inputs and/or soft outputs, e.g. by retaining multiple paths where the path metric difference falls below a threshold value. In further embodiments of the present invention, turbo codes are used. A turbo encoder is a combination of two simple encoders, where the input data is permuted by an interleaver before input to one of the two simple encoders.

The present invention may be implemented as a dedicated semiconductor chip. Embodiments of the invention may be constructed using at least one standard cell. A standard cell is a logic unit which may be used as a building block for building more complex circuits. Standard cells may be made available as selections from a standard cell library. A customised selection of logic units from the library may be provided on a single chip to allow simplification of a particular implementation of the logic units. In addition, embodiments of the invention may be provided as standard cells, and made available within a standard cell library. However, the present invention is not limited to such a technology or design. A further embodiment of the invention is an integrated circuit including any detector according to the invention. The invention also encompasses circuit boards including any detector according to the invention, and digital electronic devices including any detector according to the invention.

The present invention can be implemented by software or programmable computing apparatus. This includes any computer, including PDAs (personal digital assistants), mobile phones, etc. Thus the present invention encompasses a carrier medium carrying computer readable code for configuring a computer or number of computers as the apparatus of the invention. The carrier medium can comprise a transient medium, e.g. an electrical, optical, microwave, RF, electromagnetic, acoustic or magnetic signal (e.g. a TCP IP signal over an IP network such as the internet), or a carrier medium such as a floppy disk, CD ROM, hard disk, or programmable memory device.

The code for each process in the methods according to the invention may be modular, or may be arranged in an alternative way to perform the same function. The methods and apparatus according to the invention are applicable to any computer.

Instead of calculating path metric differences for use in further calculations, it may be possible to use either components of these path metric differences, or path metrics themselves, to achieve the same affect in the further calculations.

The present invention can be used in a wide range of communications technology, including 3G cellular technology (e.g. CMDA2000, W-CDMA, TD-SCDMA), digital video broadcasting (DVB), digital audio broadcasting (DAB), broadband wireless (e.g. LMDS—local multipoint distribution service), multipoint multichannel distribution service (MMDS), wireless LAN (local area network) such as WLAN-802.11a, digital subscriber line technology (xDSL), cable modem and satellite communications.

The present invention may also be applied in other fields of technology where Viterbi is used for convolution decoding.

While the invention has been described in terms of what are at present its preferred embodiments, it will be apparent to those skilled in the art that various changes can be made to the preferred embodiments without departing from the scope of the invention, which is defined by the claims.

The invention claimed is:

1. A calculating apparatus for use in a maximum likelihood detector, the calculating apparatus comprising:
   a receiver to receive convolution encoded data which may include added noise, the convolution encoded data having a constraint length;
   a first calculator to calculate a first component of a first path metric difference between two state sequences, each state sequence being a possible state sequence corresponding to a section of received data of length equal to said constraint length, the two state sequences starting at a common state and ending at a common state, said first calculator being adapted to calculate said first component using said received data and using convolution encoding parameters of said received data, wherein the first component is independent of the two state sequences; and
   a second calculator to calculate a second component of said first path metric difference using said two state sequences, wherein the second component is independent of said received data, and said second calculator is adapted to use the first and second components to determine a relative likelihood that each of the two state sequences corresponds to the section of received data, wherein:
   said second calculator is adapted to calculate a first component of a second path metric difference between a first of said two state sequences and a third state sequence having the same length as the first sequence, the third state sequence starting at a same state as a fourth state sequence and ending at a same state as the fourth state sequence, and the third sequence and the first sequence having one common end state, but the third sequence and the first sequence each having a different second end state, using said first path metric difference and using a path metric difference between the third and fourth state sequences;

said first calculator is adapted to calculate a second component of said second path metric difference using said convolution encoded data, and to use the first component and the second component of the second path metric difference to obtain relative likelihoods that the first and third sequences correspond to the section of received data; and said first calculator is adapted to calculate a first part of the second component of said second path metric difference using the first and third sequences, said first part being independent of the convolution encoded data; and said first calculator is adapted to calculate a second part of the second component of said second path metric difference using the convolution encoded data, said second part being independent of said common end state of the first and third sequences.

2. A calculating apparatus as claimed in claim 1, wherein said common end state of the first and third sequences corresponds to an earlier time than said second end states of the first and third sequences.

3. A calculating apparatus as claimed in claim 1, wherein said common end state of the first and third sequences corresponds to a later time than said second end states of the first and third sequences.

4. A calculating apparatus as claimed in claim 1, wherein the first calculator is adapted use each of a plurality of possible different middle states for one of said two sequences to obtain each of a plurality of corresponding relative likelihoods for the two sequences.

5. A calculating apparatus as claimed in claim 1, wherein said path metrics are calculated as a sum, for all encoded states in a sequence, of the square of the difference between said encoded state in the sequence and a corresponding convolution encoded data value.

6. A calculating apparatus as claimed in claim 1, wherein the first and second calculators are configured to use convolution encoded data with a constraint length of 2.

7. A calculating apparatus as claimed in claim 1, wherein the first and second calculators are configured to use convolution encoded data with a constraint length of 5.

8. A calculating apparatus as claimed in claim 1, wherein the first and second calculators are configured to receive a signal indicating a value of a constraint length for particular convolution encoded data, and to use the received value of the constraint length for calculating relative likelihoods for said particular convolution encoded data.

9. A calculating apparatus for use in a maximum likelihood detector, the calculating apparatus comprising:
a receiver to receive convolution encoded data which may include added noise, the convolution encoded data having a constraint length;
a first calculator to calculate a first component of a first path metric difference between two state sequences, each state sequence being a possible state sequence corresponding to a section of received data of length equal to said constraint length, the two state sequences starting at a common state and ending at a common state, said first calculator being adapted to calculate said first component using said received data and using convolution encoding parameters of said received data, wherein the first component is independent of the two state sequences; and
a second calculator to calculate a second component of said first path metric difference using said two state sequences, wherein the second component is independent of said received data, and said second calculator is adapted to use the first and second components to determine a relative likelihood that each of the two state sequences corresponds to the section of received data, wherein the second component of the first path metric difference is calculated as:

$$\sum_{k=0}^{K-1}(a_k^2 - b_k^2)$$

where $a_k$ are convolution encoded values corresponding to the first sequence of states, $b_k$ are convolution encoded values corresponding to the second sequence of states, and K is the constraint length.

10. A calculating apparatus as claimed in claim 1 wherein:
said convolution encoding parameters are coefficients $g_n$ of a generator function:

$$G(D) = \sum_{n=0}^{K-1} g_n D^n$$

where $D^n$ is an operator applied to an input to represent a delay of n units, and where $g_n$ is a weighting corresponding to a delay of n time units.

11. A calculating apparatus for use in a maximum likelihood detector, the calculating apparatus comprising:
a receiver to receive convolution encoded data which may include added noise, the convolution encoded data having a constraint length;
a first calculator to calculate a first component of a first path metric difference between two state sequences, each state sequence being a possible state sequence corresponding to a section of received data of length equal to said constraint length, the two state sequences starting at a common state and ending at a common state, said first calculator being adapted to calculate said first component using said received data and using convolution encoding parameters of said received data, wherein the first component is independent of the two state sequences; and
a second calculator to calculate a second component of said first path metric difference using said two state sequences, wherein the second component is independent of said received data, and said second calculator is adapted to use the first and second components to determine a relative likelihood that each of the two state sequences corresponds to the section of received data, wherein the first component of the first path metric difference is calculated as:

$$2\sum_{k=0}^{K-1} g_k R_{T+k}$$

where $g_k$ are generator function coefficients and $R_{t+k}$ is the convolution encoded data for time t+k.

12. A calculating apparatus as claimed in claim 1, wherein the first part of the second component of the second path metric difference is:

$$\frac{1}{2}\sum_{k=0}^{K-1}(a_{IF,k}^2+b_{IF,k}^2-a_{0F,k}^2-b_{0F,k}^2)$$

where $a_{IF,k}$ are convolution encoded values corresponding to the first sequence of states between state I and state F, $b_{IF,k}$ are convolution encoded values corresponding to the second sequence of states between state I and state F, $a_{0F,k}$ are convolution encoded values corresponding to the third sequence of states between state 0 and state F, $b_{0F,k}$ are convolution encoded values corresponding to the fourth sequence of states between state 0 and state F, and K is the constraint length.

13. A calculating apparatus as claimed in claim 1, wherein the second part of the second component of the second path metric difference is:

$$\sum_{k=0}^{K-1}(a_{IF,k}+b_{IF,k}-a_{0F,k}-b_{0F,k})R_{T+k}$$

where $a_{IF,k}$ are convolution encoded values corresponding to one of the first sequence of states between state I and state F, $b_{IF,k}$ are convolution encoded values corresponding to the second sequence of states between state I and state F, $a_{0F,k}$ are convolution encoded values corresponding to the third sequence of states between state 0 and state F, $b_{0F,k}$ are convolution encoded values corresponding to the fourth sequence of states between state 0 and state F, $R_{t+k}$ is the convolution encoded data for time t+k, and K is the constraint length.

14. A calculating apparatus as claimed in claim 1, wherein said second calculator is a pre-calculator configured to perform calculations before receiving said convolution encoded data.

15. An add-compare-select apparatus for use in a maximum likelihood detector, comprising the calculating apparatus of claim 1, wherein the relative likelihood is a path metric difference, and comprising a selection unit to select one of the sequences of states according to the sign of said path metric difference.

16. An add-compare-select apparatus for use in a maximum likelihood detector, comprising the calculating apparatus of claim 1, wherein the relative likelihood is a path metric difference, and a selection unit to select one of the first and third sequences of states according to the sign of said path metric difference.

17. A maximum likelihood detector to determine a maximum likelihood state sequence for convolution encoded data which can be divided into a plurality of adjacent sections each of length at least K, the maximum likelihood detector comprising:
 a calculating apparatus that includes:
  a receiver for receiving convolution encoded data which may include added noise, the convolution encoded data having a constraint length;
  a first calculator to calculate a first component of a first path metric difference between two state sequences, each state sequence being a possible state sequence corresponding to a section of received data of length equal to said constraint length, the two state sequences starting at a common state and ending at a common state, the first calculator being adapted to calculate said first component using said received data and using convolution encoding parameters of said received data, wherein the first component is independent of the two state sequences; and
  a second calculator to calculate a second component of said first path metric difference using said two state sequences, wherein the second component is independent of said received data; and the second calculator is adapted to use the first and second components to determine a relative likelihood that each of the two state sequences corresponds to the section of received data, the maximum likelihood detector further comprising:
 a storage unit configured to store a plurality of possible state sequences; and
 a plurality of processing units arranged in a hierarchical structure, wherein each of the processing units of a lowest level of the hierarchy is adapted to use convolution encoded data of one said section to select a path of lowest path metric, each said processing unit one of said first or second calculators to calculate path metric differences between paths in the section;
 wherein each processing unit in a level above the lowest level of the hierarchy also includes a respective said calculating apparatus, and is adapted to calculate path metric differences between paths within a plurality of adjacent said sections using path metric differences calculated at a lower level of the hierarchy and to select a path of lowest path metric; and
 wherein one or more possible state sequences stored in the storage unit is eliminated for each selection process made by the processing units.

18. A maximum likelihood detector as claimed in claim 17, wherein said processing units are arranged in a binary tree structure.

19. A maximum likelihood detector as claimed in claim 17, adapted to select one state sequence according to a random or predetermined criteria if two or more state sequences have equal likeliness.

20. A maximum likelihood detector as claimed in claim 17, further comprising a pre-processor to process data into a format which will reduce the number of equally likely sequences of states.

21. A maximum likelihood detector as claimed in claim 17, configured to output information specifying a single state sequence of maximum likelihood.

22. A maximum likelihood detector as claimed in claim 17, configured to output information specifying a plurality of state sequences, each of which has a likelihood above a given threshold.

23. A maximum likelihood detector as claimed in claim 17, configured to output information specifying a predetermined number of all possible state sequences, selected as those state sequences of highest likelihood.

24. A maximum likelihood detector adapted to receive a continuous stream of convolution encoded data, the maximum likelihood detector having a pipelined architecture to allow pipelined processing of successive portions of received convolution encoded data, the maximum likelihood detector comprising:
 a calculating apparatus that includes:
  a receiver to receive convolution encoded data which may include added noise, the convolution encoded data having a constraint length;
  a first calculator to calculate a first component of a first path metric difference between two state sequences, each state sequence being a possible state sequence corresponding to a section of received data of length equal to said constraint length, the two state sequences starting at a common state and ending at a common state, the first calculator being adapted to calculate said first component using said received data and using convolution encoding parameters of said received data, wherein the first component is independent of the two state sequences; and a second calculator to calculate a second component of said first path metric difference using said two state sequences, wherein the second component is independent of said received data; and the second calculator is adapted to use the first and second components to determine a relative likelihood that each of the two state sequences corresponds to the section of received data, wherein the second component of the first path metric difference is calculated as:

$$\sum_{k=0}^{K-1}(a_k^2 - b_k^2)$$

where $a_k$ are convolution encoded values corresponding to the first sequence of states, $b_k$ are convolution encoded values corresponding to the second sequence of states, and K is the constraint length, the maximum likelihood detector further comprising:
a trace-back unit configured to find a sequence of states of highest likelihood for an earlier portion of the convolution encoded data using a backward determination of the state sequence of highest likelihood from a later portion of the convolution encoded data, starting said backward determination at one or more of the possible final states.

25. A magnetic data storage device including the maximum likelihood detector of claim 24.

26. A hard disk read head including the maximum likelihood detector of claim 24.

27. A hard disk read-head decoder unit comprising the maximum likelihood detector of claim 24.

28. A hard disk drive including the maximum likelihood detector of claim 24.

29. A computer apparatus containing the hard disk drive of claim 28.

30. An optical data storage device including the maximum likelihood detector of claim 24.

31. A communications receiver including the maximum likelihood detector of claim 17.

32. A computer configured as the maximum likelihood detector of claim 17.

33. A method of maximum likelihood detection, for using convolution encoded data to calculate a first path metric difference between two possible corresponding sequences of states, each sequence of states having a length equal to a constraint length K of the convolution encoded data, the two sequences starting at a same state and ending at a same state, the method comprising:

receiving, by a receiver, convolution encoded data which may include additional noise;

calculating a first component of said first path metric difference using said convolution-encoded data and using convolution encoding parameters of said convolution-encoded data, wherein the first component is independent of the two sequences;

calculating a second component of said first path metric difference using said two sequences, wherein the second component is independent of said convolution encoded data; and using the first and second components to determine relative likelihoods for the two sequences, wherein the method is for further calculating a second path metric difference between a first of said two sequences and a third sequence having the same length as the first sequence, the third sequence starting at the same state as a fourth sequence and ending at the same state as the fourth sequence, and the third sequence and the first sequence having one common end state, but the third sequence and the first sequence each having a different second end state, the method further comprising:

calculating a first component of the second path metric difference using the first path metric difference and using a path metric difference between the third and fourth sequences;

calculating a second component of said second path metric difference using said convolution encoded data, and to use the first component and the second component to determine relative likelihoods that the first and third sequences correspond to the section of received data;

calculating a first part of the second component of said second path metric difference using the first and third sequences, said first part being independent of the convolution encoded data; and calculating a second part of the second component of said second path metric difference using the convolution encoded data, said second part being independent of said common end state of the first and third sequences.

34. A method as claimed in claim 33, wherein said common end state of the first and third sequences corresponds to an earlier time than said second end states of the first and third sequences.

35. A method as claimed in claim 33, wherein said common end state of the first and third sequences corresponds to a later time than said second end states of the first and third sequences.

36. A method as claimed in claim 33, wherein calculating the first component comprises using each of a plurality of possible different middle states for one of said two sequences to obtain each of a plurality of corresponding relative likelihoods for the two sequences.

37. A method as claimed in claim 33, wherein said path metrics are calculated as a sum, for all states in a sequence, of the square of the difference between ideal received data values corresponding to said states and the actual received data values.

38. A method as claimed in claim 33, wherein the constraint length is 2.

39. A method as claimed in claim 33, wherein the constraint length is 5.

40. A method as claimed in claim 33, further comprising receiving a signal indicating the value of a constraint length for particular convolution encoded data, and using that value of the constraint length for calculating relative likelihoods for that particular convolution encoded data.

41. A method of maximum likelihood detection, for using convolution encoded data to calculate a first path metric difference between two possible corresponding sequences of states, each sequence of states having a length equal to a constraint length K of the convolution encoded data, the two sequences starting at a same state and ending at a same state, the method comprising:

receiving, by a receiver, convolution encoded data which may include additional noise;

calculating a first component of said first path metric difference using said convolution-encoded data and using convolution encoding parameters of said convolution-encoded data, wherein the first component is independent of the two sequences; and calculating a second component of said first path metric difference using said two sequences, wherein the second component is independent of said convolution encoded data; and using the first and second components to determine relative likelihoods for the two sequences, wherein the second component of the first path metric difference is calculated as:

$$\sum_{k=0}^{K-1}(a_k^2 - b_k^2)$$

where $a_k$ are convolution encoded values corresponding to the first sequence of states, $b_k$ are convolution encoded values corresponding to the second sequence of states, and K is the constraint length.

42. A method of maximum likelihood detection, for using convolution encoded data to calculate a first path metric difference between two possible corresponding sequences of states, each sequence of states having a length equal to a constraint length K of the convolution encoded data, the two sequences starting at a same state and ending at a same state, the method comprising:

receiving, by a receiver, convolution encoded data which may include additional noise;

calculating a first component of said first path metric difference using said convolution-encoded data and using convolution encoding parameters of said convolution-encoded data, wherein the first component is independent of the two sequences; and calculating a second component of said first path metric difference using said two sequences, wherein the second component is independent of said convolution encoded data; and using the first and second components to determine relative likelihoods for the two sequences, wherein said convolution encoding parameters are coefficients $g_n$ of a generator function:

$$G(D) = \sum_{n=0}^{K-1} g_n D^n$$

where $D^n$ is an operator applied to an input to represent a delay of n units, and where $g_n$ is a weighting corresponding to a delay of n time units, wherein the first component of the first path metric difference is calculated as:

$$-2\sum_{k=0}^{K-1} g_k R_{T+k}$$

where $g_k$ are the generator function coefficients and $R_{T+k}$ is the convolution encoded data for time t+k.

43. A method as claimed in claim 33, wherein the first part of the second component of the second path metric difference is:

$$\frac{1}{2}\sum_{k=0}^{K-1}(a_{IF,k}^2 + b_{IF,k}^2 - a_{0F,k}^2 - b_{0F,k}^2)$$

where $a_{IF,k}$ are convolution encoded values corresponding one of the first sequence of states between state I and state F, $b_{IF,k}$ are convolution encoded values corresponding to the second sequence of states between state I and state F, $a_{0F,k}$ are convolution encoded values corresponding to the third sequence of states between state 0 and state F, $b_{0F,k}$ are convolution encoded values corresponding to the fourth sequence of states between state 0 and state F and K is the constraint length.

44. A method as claimed in claim 33, wherein the second part of the second component of the second path metric difference is:

$$\sum_{k=0}^{K-1}(a_{IF,k} + b_{IF,k} - a_{0F,k} - b_{0F,k})R_{T+k}$$

where $a_{1F,k}$ are convolution encoded values corresponding to the first sequence of states between state I and state F, $b_{IF,k}$ are convolution encoded values corresponding to the second sequence of states between state I and state F, $a_{0F,k}$ are convolution encoded values corresponding to the third sequence of states between state 0 and state F, $b_{0F,k}$ are convolution encoded values corresponding to the fourth sequence of states between state 0 and state F, $R_{t+k}$ is the convolution encoded data for time t+k and K is the constraint length.

45. A method as claimed in claim 33, comprising pre-calculating said components or parts of components of the path metric differences which are independent of the convolution encoded data.

46. A method as claimed in claim 33, further comprising selecting one of the sequences of states according to the sign of the first path metric difference.

47. A method as claimed in claim 33, further comprising selecting one of the first and third sequences of states according to the sign of the second path metric difference.

48. A method as claimed in claim 33, further comprising choosing one state sequence according to a random or predetermined criteria if two or more state sequences have equal likeliness.

49. A method as claimed in claim 33, further comprising pre-processing data into a format which will reduce the number of equally likely sequences of states.

50. A method as claimed in claim 33, comprising outputting information specifying a single state sequence of maximum likelihood.

51. A method as claimed in claim 33, comprising outputting information specifying a plurality of state sequences, each of which has a likelihood above a given threshold.

52. A method as claimed in claim 33, comprising outputting information specifying a predetermined number of all possible state sequences, selected as those state sequences of highest likelihood.

53. A method of maximum likelihood detection by a convolution detector, which uses convolution encoded data to calculate a first component of a first path metric difference between two possible corresponding sequences of states, each sequence of states having a length equal to a constraint length K of the convolution encoded data, the two sequences starting at a same state and ending at a same state, the method comprising:

receiving, by a receiver, a continuous stream of convolution encoded data, said convolution detector having a pipelined architecture to allow pipelined processing of successive portions of the received convolution encoded data;

calculate a second component of said first path metric difference using said two state sequences;

using the first and second components to determine a relative likelihood that each of the two state sequences corresponds to the section of received data, wherein the second component of the first path metric difference is calculated as:

$$\sum_{k=0}^{K-1}(a_k^2 - b_k^2)$$

where $a_k$ are convolution encoded values corresponding to the first sequence of states, $b_k$ are convolution encoded values corresponding to the second sequence of states; and performing a trace-back process to find a sequence of states of highest likelihood for an earlier portion of the convolution encoded data using a backward determination of the state sequence of highest likelihood from a later portion of the convolution encoded data, starting said backward determination at one or more of the possible final states.

54. A computer configured to perform the method of claim 33.

55. A maximum likelihood detector as claimed in claim 20, wherein the pre-processor is adapted to calculate each first weighting value using a received data value, a possible ideal received value wherein ideal means without said noise and a noise correlation estimate.

56. A data storage device including the maximum likelihood detector of claim 1.

57. A data storage device including the maximum likelihood detector of claim 9.

58. A data storage device including the maximum likelihood detector of claim 10.

59. A data storage device including the maximum likelihood detector of claim 11.

60. A data storage device including the maximum likelihood detector of claim 17.

* * * * *